United States Patent
Nakai

(10) Patent No.: US 7,272,042 B2
(45) Date of Patent: Sep. 18, 2007

(54) SEMICONDUCTOR INTEGRATED CIRCUIT DEVICE

(75) Inventor: Hiroto Nakai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/405,931

(22) Filed: Apr. 17, 2006

(65) Prior Publication Data

US 2006/0198191 A1 Sep. 7, 2006

Related U.S. Application Data

(63) Continuation of application No. 10/753,212, filed on Jan. 7, 2004, now Pat. No. 7,061,802.

(30) Foreign Application Priority Data

Apr. 25, 2003 (JP) ............................. 2003-122810

(51) Int. Cl.
*G11C 16/04* (2006.01)

(52) U.S. Cl. ............ 365/185.17; 365/212; 365/230.03; 365/185.11; 365/185.05

(58) Field of Classification Search ............ 365/185.17
See application file for complete search history.

(56) References Cited

U.S. PATENT DOCUMENTS

| | | | | |
|---|---|---|---|---|
| 5,515,327 | A | * 5/1996 | Matsukawa et al. | 365/203 |
| 6,275,434 | B1 | 8/2001 | Yamada et al. | 365/206 |
| 6,807,101 | B2 | 10/2004 | Ooishi et al. | 365/185.21 |
| 7,061,802 | B2 * | 6/2006 | Nakai | 365/185.13 |

OTHER PUBLICATIONS

Ken Takeuchi et al., "A Dual Page Programming Scheme for High-Speed Multi-Gb-Scale NAND Flash Memories", 2000 Symposium on VLSI Circuits Digest of Technical Papers, pp. 156-157.

* cited by examiner

*Primary Examiner*—Thong Q. Le
(74) *Attorney, Agent, or Firm*—Hogan & Hartson LLP

(57) ABSTRACT

A semiconductor integrated circuit device includes a global-bit line, first and second section bit lines, a first transistor which connects the global bit line with the first section line, a second transistor which connects the global bit line with the second section bit line, a section selection circuit which selects one of the first and the second transistors, and a data latch circuit. The data latch circuit includes a data amplifier circuit which amplifies readout data from the first and the second section bit lines, a first data holding circuit which holds readout data and programming data to the first section bit line, and a second data holding circuit which holds readout data and programming data to the second section bit line.

10 Claims, 28 Drawing Sheets

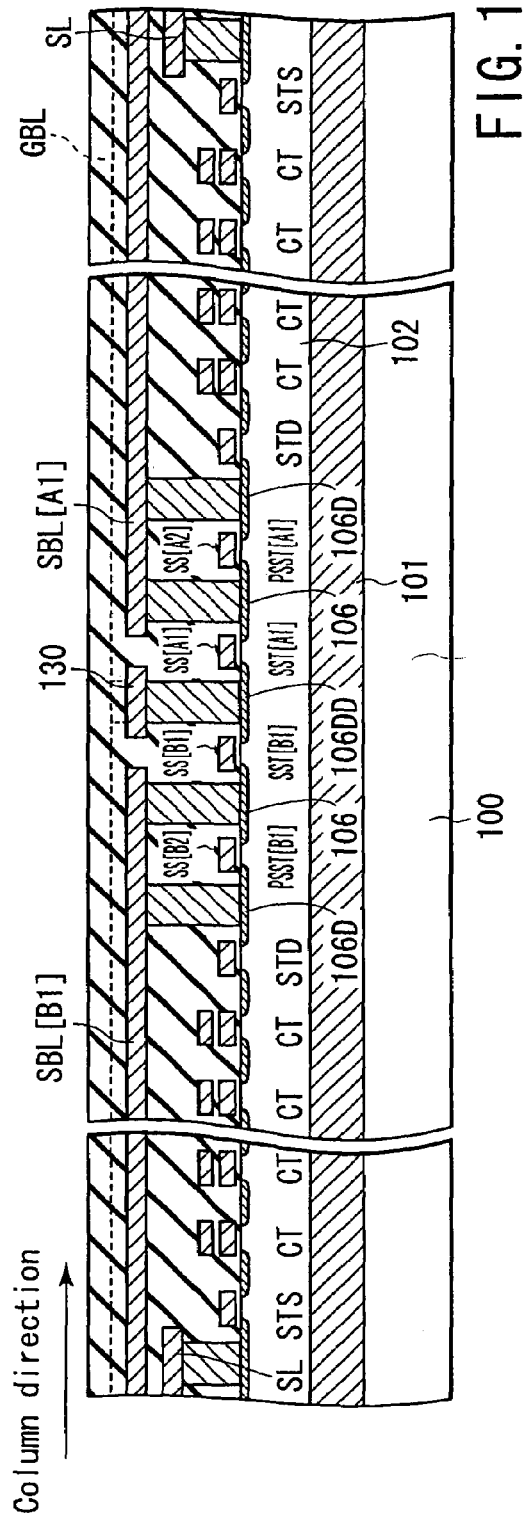
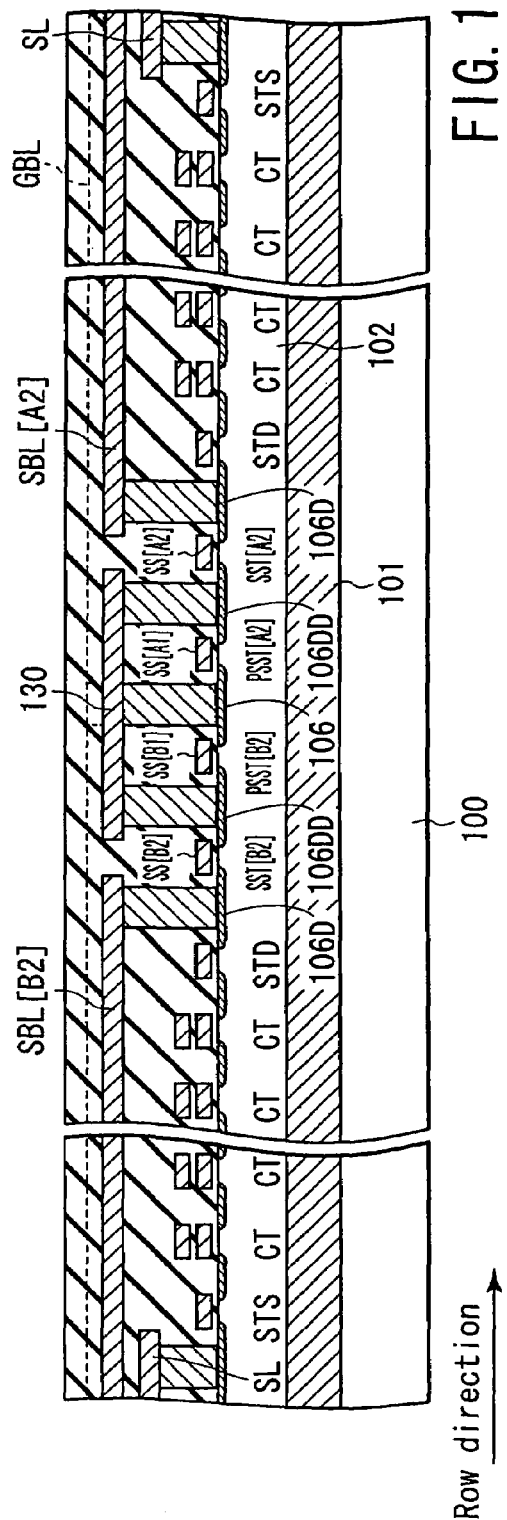

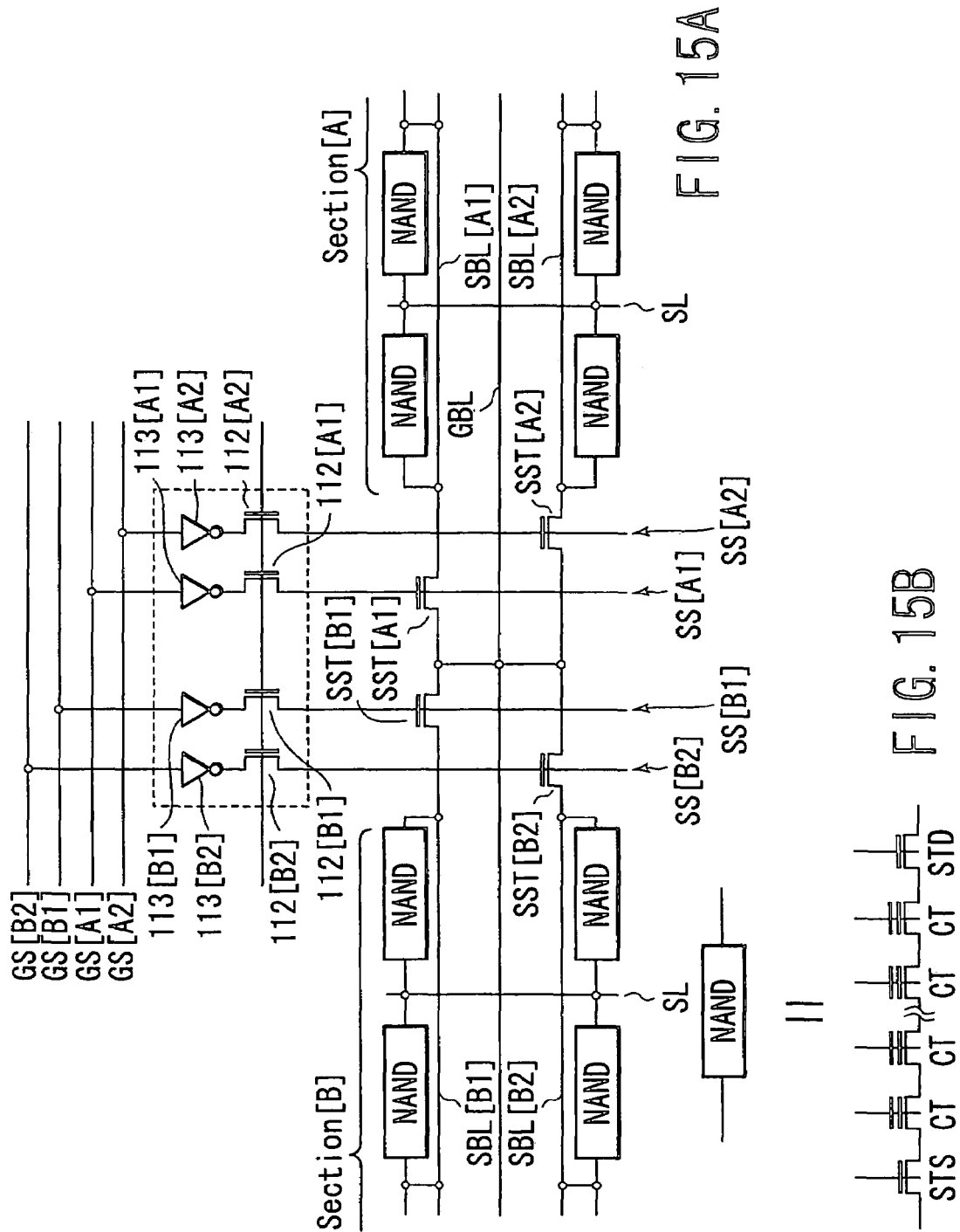

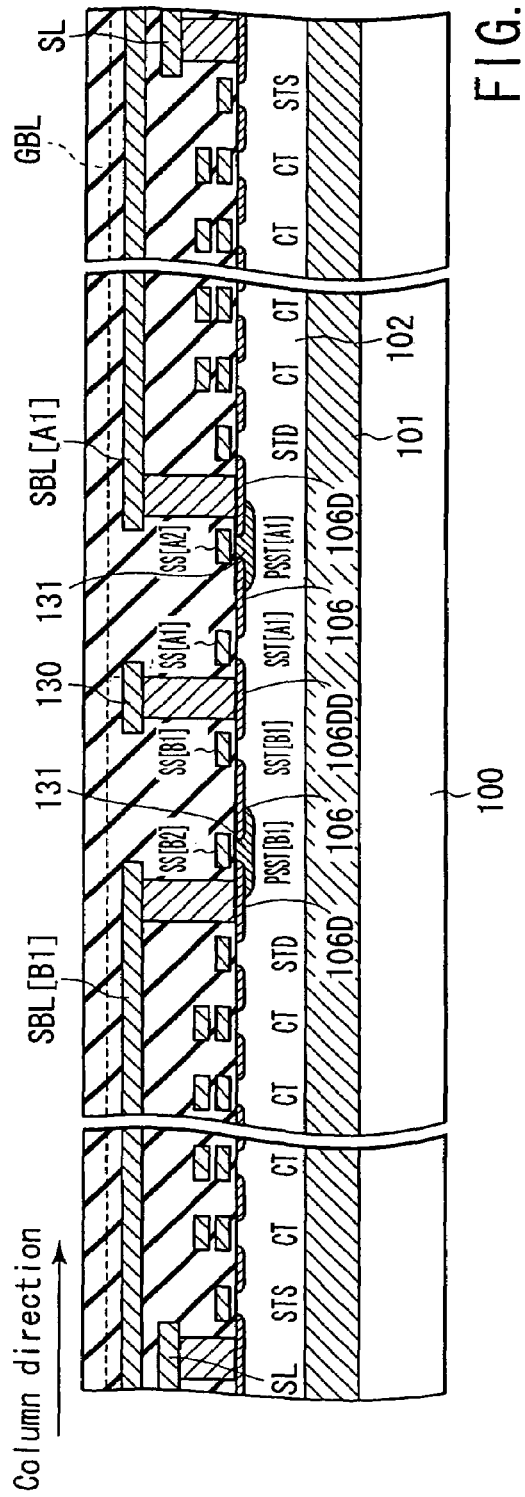
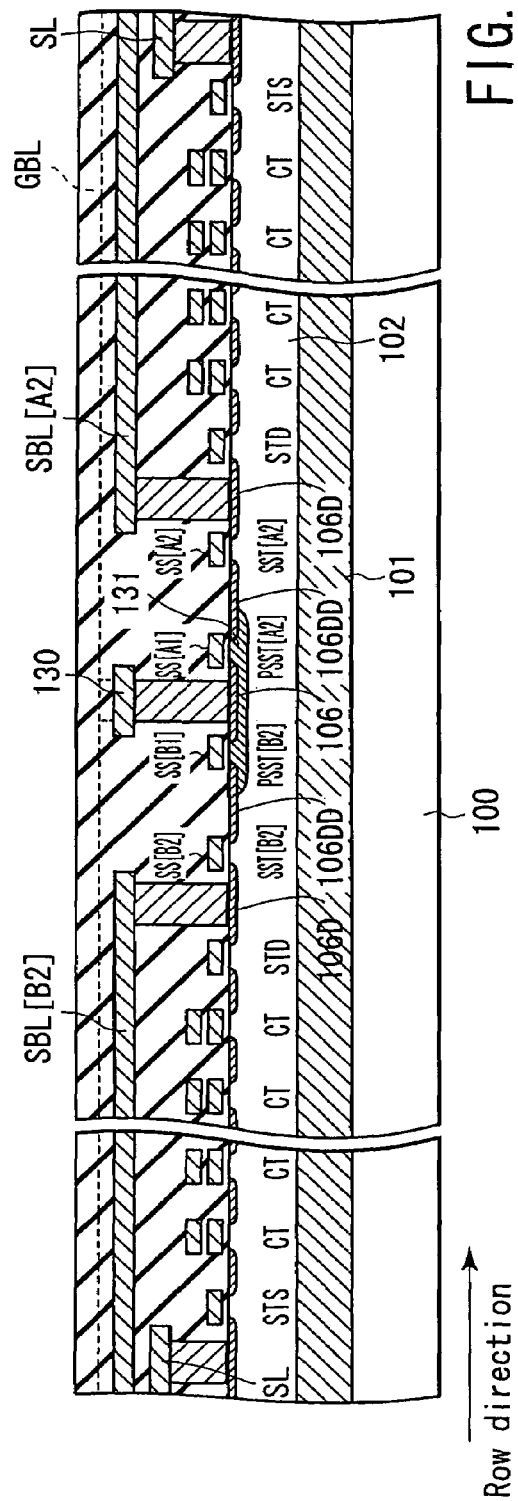
FIG. 19A
FIG. 19B

US 7,272,042 B2

SEMICONDUCTOR INTEGRATED CIRCUIT DEVICE

CROSS-REFERENCE TO RELATED APPLICATIONS

This is a continuation of application Ser. No. 10/753,212 filed Jan. 7, 2004 now U.S. Pat. No. 7,061,802, the entire contents of which are incorporated by reference. This application also claims benefit of priority under 35 U.S.C. § 119 to Japanese Patent Application No. 2003-122810 filed Apr. 25, 2003, the entire contents of which are incorporated herein by reference.

BACKGROUND OF THE INVENTION

1. Field of the Invention

This invention relates to a semiconductor integrated circuit device and more particularly to a erasable programmable nonvolatile semiconductor memory device.

2. Description of the Related Art

In recent years, a erasable programmable nonvolatile semiconductor memory device is rapidly popularized as a recording medium of a portable electronic device.

In such a nonvolatile semiconductor memory device, a high speed programming operation is strongly required in the digital still camera market, for example. This is because the capacity of the recording medium for storing photographs or the like is rapidly increasing.

In order to meet the above requirement, in the nonvolatile semiconductor memory device, the programming page length is made large and the number of memory cells simultaneously subjected to the programming process is increased, to enhance the programming speed. For example, the page length of a NAND nonvolatile semiconductor memory device is normally set to 512 bytes. For example, the page length is increased to 2 Kbytes, that is, increased by four times. Thus, the programming speed can be enhanced by approximately four times in comparison with a device having the page length of 512 bytes.

A typical example of this type of NAND nonvolatile semiconductor memory device is shown in FIG. 1.

As shown in, FIG. 1, a memory cell array and a data latch circuit of 512 bytes are provided as one block and four blocks are arranged in one chip. If the memory capacity is kept unchanged, the number of memory cells contained in one memory cell array can be reduced to ¼ the original value. However, the rate of an area of the data latch circuit of 512 bytes (=4 Kbits) which occupies the whole chip area is high. If the four data latch circuits (2 Kbytes (=16 Kbits)) are arranged or eight data latch circuits (4 Kbytes (=32 Kbits)) are arranged to further enhance the programming speed, the chip area is increased.

Document 1 is provided in which a programming method for enhancing the programming speed, while suppressing an increase in the number of data latch circuits, is described.

In a typical NAND nonvolatile semiconductor memory device, approximately 1000 NAND strings are connected to each bit line. In a programming period, one of the approximately 1000 NAND strings which contains a cell transistor to be programmed is selected. For this, 0V is continuously supplied to the channel of the cell transistor from the data latch circuit so as to supply a sufficient amount of charge (for example, electrons) to the floating gate of the cell transistor, for example. However, the amount of charge injected into the floating gate becomes smaller as the cell transistor is more miniaturized. Therefore, as described in the document 1, a NAND nonvolatile semiconductor memory device in which charges stored in the bit line are injected into the floating gate of the cell transistor is proposed.

As described in document 1, the data latch circuit (page buffer) is arranged at the center of the chip and memory cell arrays are arranged on the upper and lower sides of the data latch circuit. The data programming operation is performed for the upper bank memory cell array and lower bank memory cell array at the same time by using charges stored in bit lines of the upper bank memory cell array and bit lines of the lower bank memory cell array. As a result, the programming operation speed can be enhanced while an increase in the data latch circuit is suppressed.

Document 1: Ken. Takeuchi et al. "A Dual Page Programming Scheme for High-Speed Multi-Gb-Scale NAND Flash Memories" 2000 Symposium on VLSI Circuits Digest of Technical Papers pp. 156-157.

BRIEF SUMMARY OF THE INVENTION

A semiconductor integrated circuit device according to an aspect of the present invention comprises a global bit line; a first section bit line; a first section selection transistor which connects the global bit line to the first section bit line; a first memory cell in which data can be reprogrammed and which is connected to the first section bit line; a second section bit line; a second section selection transistor which connects the global bit line to the second section bit line; a second memory cell in which data can be reprogrammed and which is connected to the second section bit line; a section selecting circuit which selects one of the first and second section selection transistors; and a data latch circuit which receives potential of the global bit line and supplies potential to the global bit line; wherein the data latch circuit includes a data amplifier circuit which amplifies first readout data read out from the first memory cell and second readout data read out from the second memory cell, a first data holding circuit which holds first programming data to be programmed into the first memory cell and the first readout data, and a second data holding circuit which holds second programming data to be programmed into the second memory cell and the second readout data.

BRIEF DESCRIPTION OF THE SEVERAL VIEWS OF THE DRAWING

FIG. 14A is a cross sectional view taken along the 14A-14A line of FIG. 13;

FIG. 14B is a cross sectional view taken along the 14B-14B line of FIG. 13;

FIG. 15A is a circuit diagram showing a circuit example of a section selecting circuit;

FIG. 15B is a circuit diagram showing an example of the equivalent circuit of a NAND string;

FIG. 19A is a cross sectional view taken along the 19A-19A line of FIG. 18;

FIG. 19B is a cross sectional view taken along the 19B-19B line of FIG. 18;

DETAILED DESCRIPTION OF THE INVENTION

In recent years, the data storage capacity of a recording medium is rapidly increased and a high speed programming operation of a nonvolatile semiconductor memory device is strongly required. If a typical method for "making a programming page length large and increasing the number of memory cells which are simultaneously subjected to the programming process" is used in order to enhance the programming operation speed, there occurs a problem that the scale of the data latch circuit is increased and the chip area is increased.

If the programming method described in the document 1 is used, an increase in the scale of the data latch circuit can be suppressed. However, the factor which increases the chip area is not limited to area of the data latch circuit.

There will now be described embodiments of this invention with reference to the accompanying drawings. Common portions are denoted by the same reference symbols throughout the drawings.

FIRST EMBODIMENT

In a nonvolatile semiconductor memory device according to a first embodiment of this invention, bit lines are divided into global bit lines and section bit lines and charges stored in the section bit lines are used for data programming. Therefore, it enables simultaneously programming data into a plurality of sections which are connected to the same global bit line and permit a data latch circuit to be commonly used by a plurality of sections. As a result, the programming operation speed can be enhanced while an increase in the circuit scale of the data latch circuit is suppressed.

Figure 2:
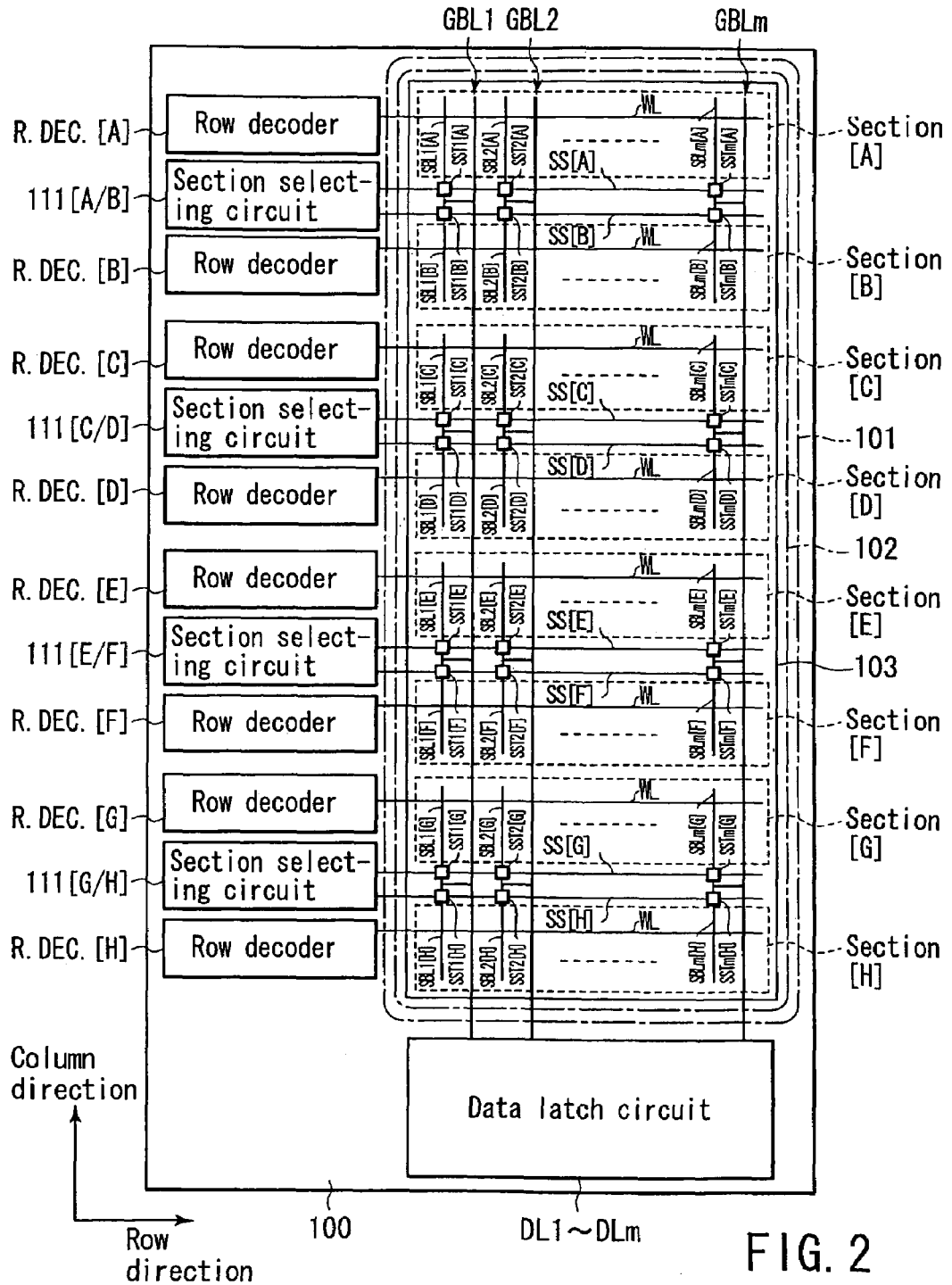
FIG. 2 is a block diagram showing an example of the configuration of a nonvolatile semiconductor memory device according to a first embodiment of this invention.
Figure 3:
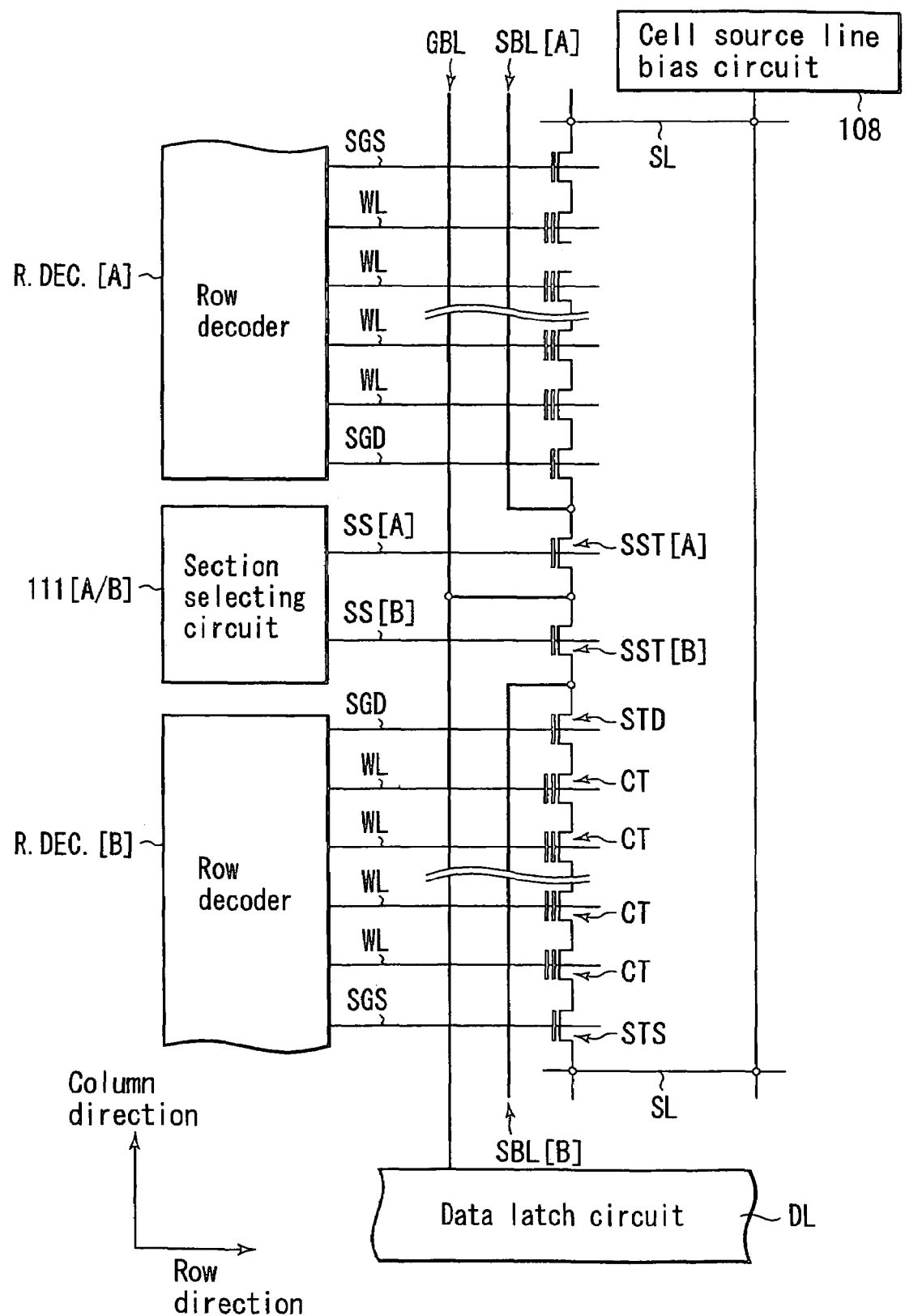
FIG. 3 is an equivalent circuit diagram showing an example of the equivalent circuit of a memory cell array.

FIG. 2 is a block diagram showing an example of a configuration of the nonvolatile semiconductor memory device according to the first embodiment of this invention, and FIG. 3 is an equivalent circuit diagram showing an example of the equivalent circuit of the memory cell array. In the first embodiment, a case wherein data is simultaneously programmed into selected memory cells of eight sections from [A] to [H] is explained as an example, but the number of sections into which data is simultaneously programmed is not limited to eight and the division number of sections can be freely set.

As shown in FIGS. 2 and 3, for example, a cell N-type well region 101 is formed in a P-type semiconductor substrate 100 and a cell P-type well region 102 is formed in the cell N-type well region 101. A memory cell array 103 is formed in the cell P-type well region 102. The memory cell array 103 of this example is divided into the eight sections from [A] to [H]. The eight sections from [A] to [H] are arranged along a direction in which the bit lines extend (which is defined as a column direction in this specification). Above the memory cell array 103, m global bit lines from GBL1 to GBLm are arranged. The global bit lines from GBL1 to GBLm are arranged along a direction which intersects with the column direction and in which the word lines extend (which is defined as a row direction in this specification). In each of the sections from [A] to [H], m section bit lines from SBL1 to SBLm are arranged. The section bit lines from SBL1 to SBLm are arranged in the row direction. A plurality of erasable programmable memory cells are connected to each of the section bit lines from SBL1 to SBLm. As one example of the memory cell, a NAND memory cell is used. As shown in FIG. 3, the NAND memory cell includes a drain-side block selection transistor STD, a source-side block selection transistor STS and at least one cell transistor CT connected between the transistors STD and STS. In this specification, a transistor unit including the transistors STD, CT and STS is called as a NAND string. One example of the configuration of the NAND string is shown in FIGS. 4, 5A and 5B.

Figure 4:
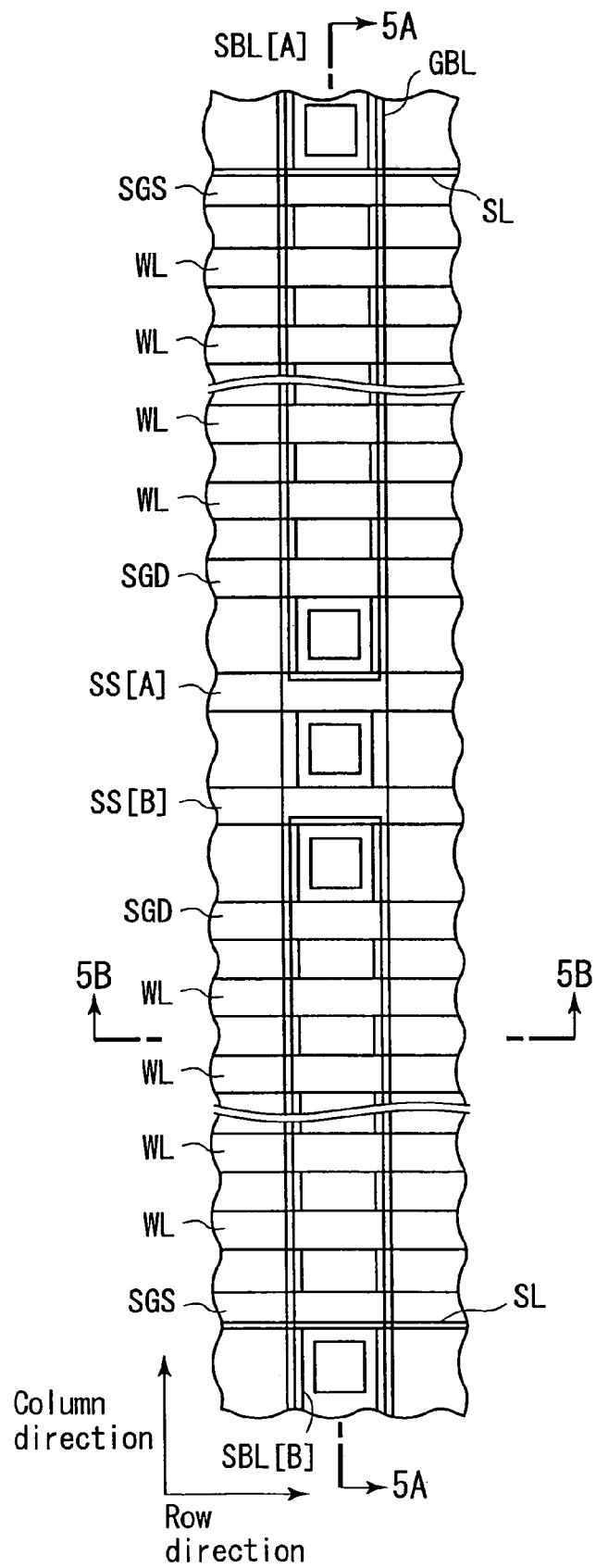
FIG. 4 is a plan view showing an example of the plane pattern of the memory cell array.
Figure 5A:
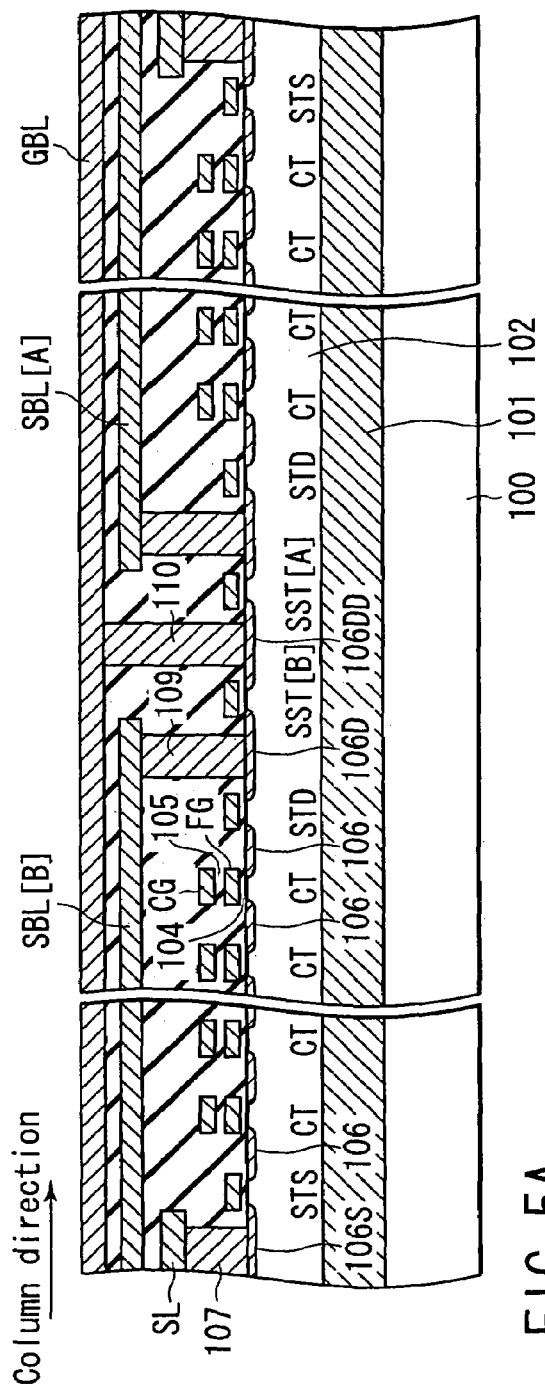
FIG. 5A is a cross sectional view taken along the 5A-5A line of FIG. 4.
Figure 5B:
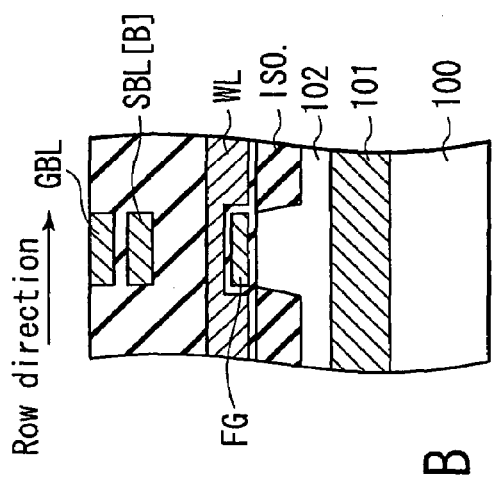
FIG. 5B is a cross sectional view taken along the 5B-5B line of FIG. 4.

FIG. 4 is a plan view showing an example of a plane pattern of the memory cell array 103 in the device of the first embodiment, FIG. 5A is a cross sectional view taken along the 5A-5A line of FIG. 4 and FIG. 5B is a cross sectional view taken along the 5B-5B line of FIG. 4.

As shown in FIGS. 4, 5A and 5B, for example, a cell N-type well region 101 is formed in a P-type semiconductor substrate 100 of P-type silicon and a cell P-type well region 102 is formed in the cell N-type well region 101. On the surface of the cell P-type well region 102, for example, tunneling insulation films 104 each formed of a silicon oxide film are formed. A floating gate FG is formed on each of the tunneling insulation films 104 and, for example, an insulating film with a three-layered structure of silicon oxide film-silicon nitride film-silicon oxide film is formed on each floating gate FG as an inter-level insulating film 105. A control gate CG is formed on each inter-level insulating film 105. The control gate CG is used to configure a word line WL. Each of the cell transistors CT is configured by a threshold variable transistor having a stacked gate structure which has the tunneling insulation film 104, floating gate FG, inter-level insulating film 105 and control gate CG, for example. The cell transistor CT is configured by the threshold variable transistor having the stacked gate structure, for example, but the configuration of the cell transistor is not limited to the above configuration.

Each of source/drain diffusion layers 106 of the cell transistors CT is commonly used by the adjacent cell transistors CT and thus the cell transistors CT are connected in series. The series-connected cell transistors CT are connected between a drain-side block selection transistor STD and a source-side block selection transistor STS.

One of the source/drain diffusion layers 106 of the transistor STS is also used as the source/drain diffusion layer 106 of the adjacent cell transistor CT. The other one (106S) of the source/drain diffusion layers 106 of the transistor STS is also used as the source/drain diffusion layer 106 (106S) of the transistor STS of the adjacent NAND string. The source/drain diffusion layer 106S is connected to a cell source line SL via a conductive plug 107, for example. The source line SL of this example is formed of a first metal layer. The source line SL extends in the row direction and is connected to a cell source line bias circuit 108 arranged in a region other than the cell well regions 101, 102, for example.

One of the source/drain diffusion layers 106 of the transistor STD is also used as the source/drain diffusion layer 106 of the adjacent cell transistor CT. The source/drain diffusion layers 106D is connected to a section bit line SBL via a conductive plug 109, for example. The bit line SBL is formed of a second metal layer formed on the first metal layer, for example. Each of the bit lines SBL extend in the column direction and is connected to the NAND string of one column arranged in each of the sections from [A] to [H] via a corresponding one of the drain-side block selection transistors STD.

In this example, the number of cell transistors CT connected in series between the transistors STS and STD is set to eight, but the number of series-connected cell transistors is not-limited to eight. The number of series-connected cell transistors can be set larger or smaller than eight. Of course, a so-called 3-transistor memory cell having one cell transistor CT connected between the transistors STS and STD can be used and a memory cell having a plurality of cell transistors CT connected in parallel between the transistors STS and STD can be used.

Section bit lines SBL1[A] to SBLm[A] among the section bit lines SBL1 to SBLm which are arranged in the section [A] are connected to the global bit lines GBL1 to GBLm via section selection transistors SST1[A] to SSTm[A]. Likewise, section bit lines SBL1[B] to SBLm[B] arranged in the section [B] are connected to the global bit lines GBL1 to GBLm via section selection transistors SST1[B] to SSTm [B], . . . , and section bit lines SBL1[H] to SBLm[H] arranged in the section [H] are connected to the global bit lines GBL1 to GBLm via section selection transistors SST1 [H] to SSTm[H].

The transistors SST1[A] to SSTm[A] connect the global bit lines GBL1 to GBLm to the section bit lines SBL1[A] to SBLm(A) when the section [A] is selected. Likewise, the transistors SST1[B] to SSTm[B] connect the global bit lines GBL1 to GBLm to the section bit lines SBL1[B] to SBLm [B] when the section [B] is selected, . . . , and the transistors SST1[H] to SSTm[H] connect the global bit lines GBL1 to GBLm to the section bit lines SBL1[H] to SBLm[H] when the section [H] is selected. The transistors SST1[A] to SSTm[A] and transistors SST1[B] to SSTm[B] of this example are arranged between the sections [A] and [B] and commonly use the contacts with the global bit lines GBL1 to GBLm. Likewise, the transistors SST1[C] to SSTm[C] and transistors SST1[D] to SSTm[D] are arranged between the sections [C] and [D] and commonly use the contacts with the global bit lines GBL1 to GBLm, . . . , and the transistors SST1[G] to SSTm[G] and transistors SST1[H] to SSTm[H] are arranged between the sections [G] and [H] and commonly use the contacts with the global bit lines GBL1 to GBLm. Like the cell transistors CT, the section selection transistors SST are formed on the cell P-type well region 102. As the gate insulating film of the section selection transistor SST, the same film as the tunneling insulation film 104 of the cell transistor CT is used, for example. The thickness of the gate insulating film of the section selection transistor SST is set to the same thickness as that of the tunneling insulation film 104 of the cell transistor CT.

In the boundary portion between the sections, the source/drain diffusion layer 106D of the drain-side block selection transistor STD is also used as one of the source/drain diffusion layers 106 of the section selection transistor SST [A]. The other one [106DD] of the source/drain diffusion layers 106 of the section selection transistor SST[A] is also used as the source/drain diffusion layer 106 (106DD) of the section selection transistor SST[B] in the adjacent section. For example, the source/drain diffusion layer 106DD is connected to the global bit line GBL via a conductive plug 110. For example, the global bit line GBL is formed of a third metal layer formed on the second metal layer. Each of the global bit lines GBL extends in the column direction and is connected to the section bit lines SBL of one column respectively arranged in the sections [A] to [H] via the corresponding section selection transistors SST. The sections [A] to [H] are selected by a section selecting circuit 111.

The section selecting circuit 111 is arranged in a region other than the cell well regions 101, 102, for example, and arranged in a row decoder R.DEC. which selects the "row" of the memory cell array. The section'selecting circuit 111 in this example is divided into four circuits including section selecting circuits 111[A/B], 111[C/D], 111[E/F] and 111[G/H]. The section selecting circuit 111[A/B] supplies a signal used to select the section [A] to the gates of the transistors SST1[A] to SSTm[A] via a section selection line SS[A] and supplies a signal used to select the section [B] to the gates of the transistors SST1[B] to SSTm[B] via a section selection line SS[B]. Likewise, the section selecting circuit 111[C/D] supplies a signal used to select the section [C] to the gates of the transistors SST1[C] to SSTm[C] via a section selection line SS[C] and supplies a signal used to select the section [D] to the gates of the transistors SST1[D] to SSTm[D] via a section selection line SS[D], . . . , and the section selecting circuit 111[G/H] supplies a signal used to select the section [G] to the gates of the transistors SST1[G] to SSTm[G] via a section selection line SS[G] and supplies a signal used to select the section [H] to the gates of the transistors SST1[H] to SSTm[H] via a section selection line SS[H]. In this example, the section selecting circuit 111[A/B] is arranged between a row decoder R.DEC.[A] for the section [A] and a row decoder R.DEC.[B] for the section [B]. Likewise, the section selecting circuit 111[C/D] is arranged between a row decoder R.DEC.[C] and a row decoder R.DEC.[D], . . . , and the section selecting circuit 111[G/H] is arranged between a row decoder R.DEC.[G] and a row decoder R.DEC.[H].

Figure 6A:
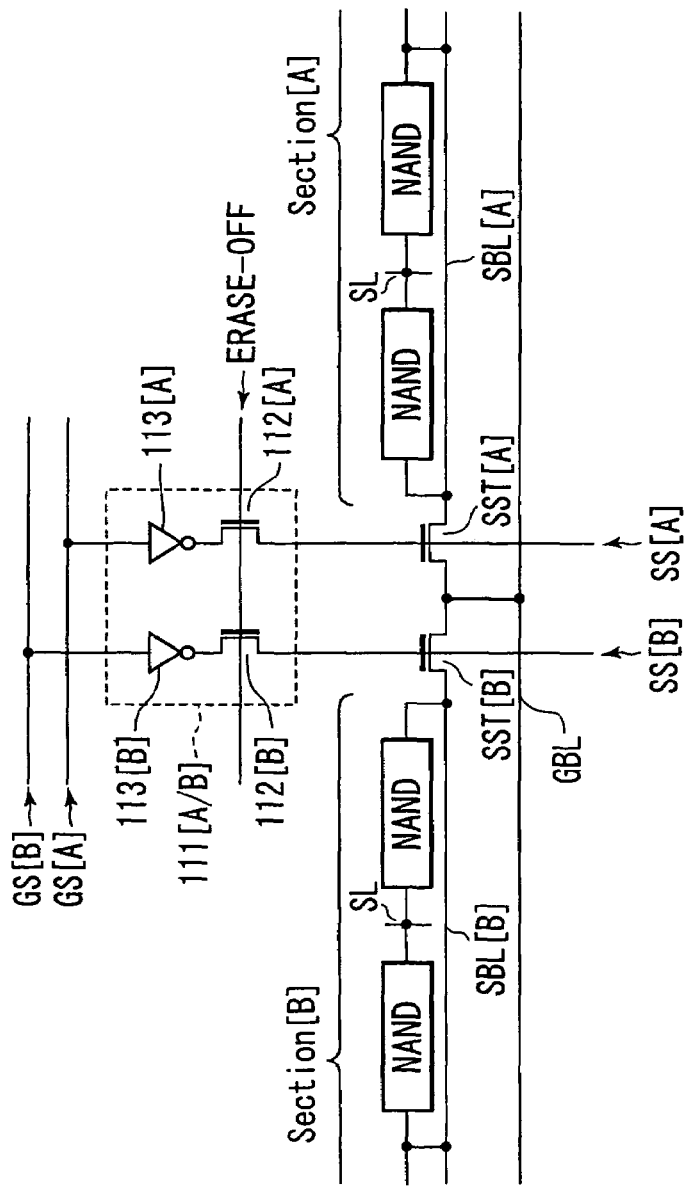
FIG. 6A is a circuit diagram showing a circuit example of a section selecting circuit.
Figure 6B:
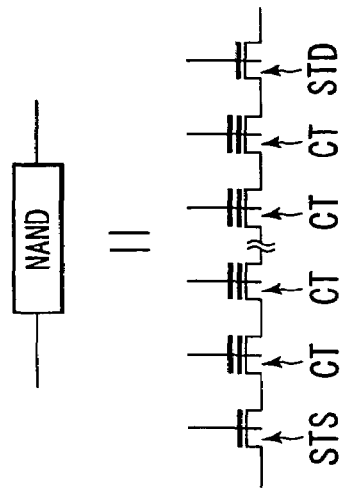
FIG. 6B is a circuit diagram showing an example of the equivalent circuit of a NAND string.

FIG. 6A is a circuit diagram showing an example of the section selecting circuit. In FIG. 6A, the section selecting circuit 111[A/B] is shown and the other section selecting circuits 111[C/D] to 111[G/H] have the same configuration. The NAND string is expressed by a rectangular box and the equivalent circuit in the box is expressed as shown in FIG. 6B.

As shown in FIG. 6A, the section selection transistors SST[A] and SST[B] having a common drain terminal which is commonly connected to the global bit line GBL are connected between the sections [A] and [B]. The gate electrodes of the transistors SST[A] and SST[B] are connected to the section selection lines SS[A] and SS[B], respectively which extend from the section selecting circuit 111[A/B]. In the section selecting circuit 111[A/B], N-channel transistors 112[A] and 112[B] of high voltage system, which set the section selection lines SS[A] and SS[B] into an electrically floating state at the erase operation time, are arranged. The gate electrodes of the high voltage transistors 112[A] and 112[B] are supplied with a signal ERASE-OFF. The signal ERASE-OFF is set at the "HIGH" level to set the high voltage transistors 112[A] and 112[B] into a conductive state at the programming operation time and read operation time and is set at the "LOW" level, for example, 0V to set the high voltage transistors 112[A] and 112[B] into a non-conductive state at the erase operation-time. The potential of the signal ERASE-OFF is supplied from a booster circuit, for example, and as an example, the potential of the "HIGH" level is set higher than the power supply voltage VCC by a threshold voltage of the N-channel transistor.

One ends of the current paths of-the high voltage transistors 112[A] and 112[B] are respectively connected to the section selection lines SS[A] and SS[B] and the other ends thereof are respectively connected to global section selecting signal lines GS[A] and GS[B] via buffer inverter circuits 113[A] and 113[B]. The potential of the signal line GS[A] of this example is set to the "LOW" level when the section [A] is selected and causes the transistor SST[A] to be turned ON via the inverter circuit 113[A] and high voltage transistor 112[A]. The potential of the signal line GS[B] is set to the "LOW" level when the section [B] is selected and causes the transistor SST[B] to be turned ON via the inverter circuit 113[B] and high voltage transistor 112[B].

The global bit lines GBL1 to GBLm are connected to data latch circuits DL1 to DLm. For example, the data latch circuits DL1 to DLm are arranged in a region other than the cell well regions 101, 102.

Figure 7:
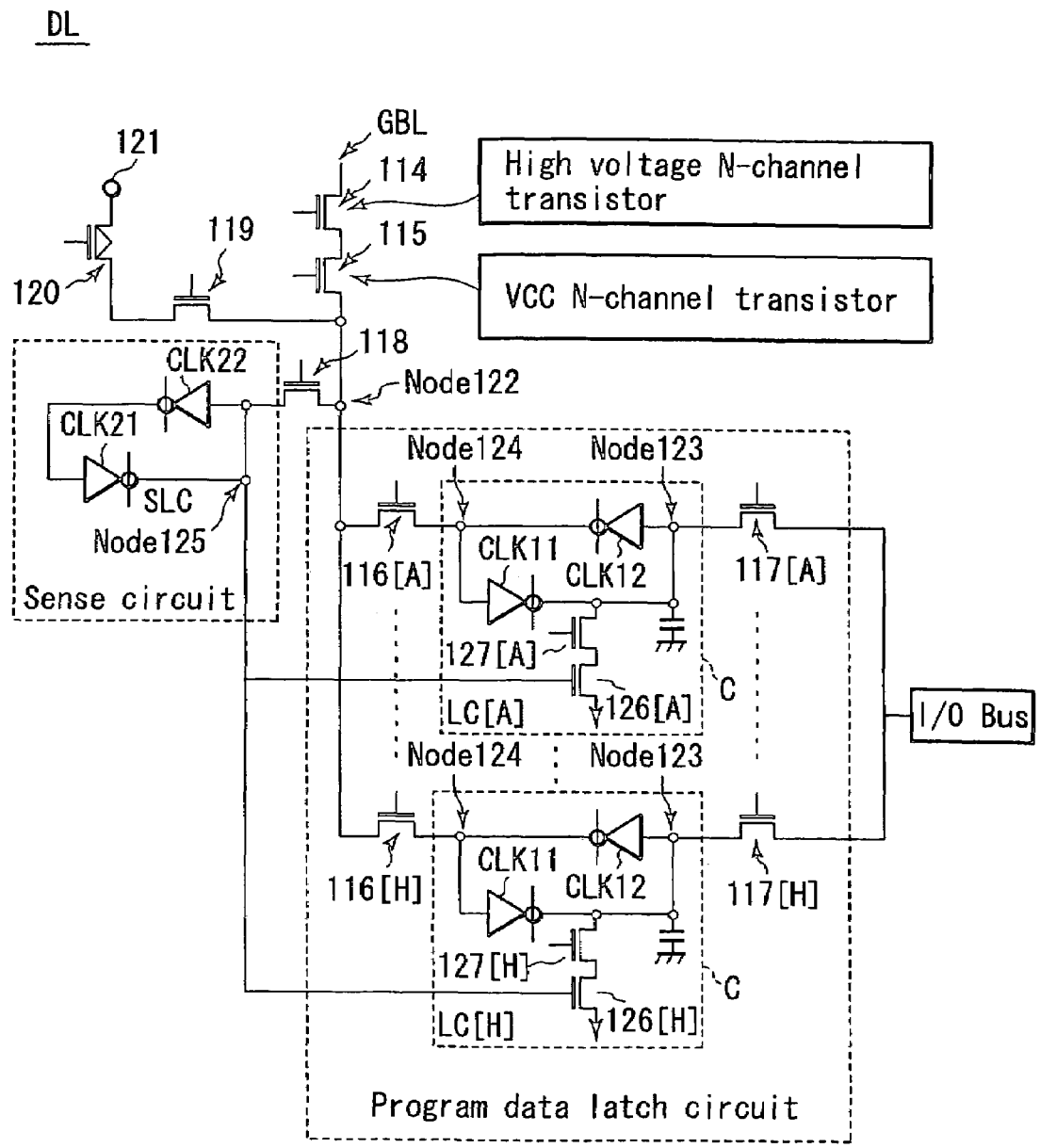
FIG. 7 is a circuit diagram showing a circuit example of a data latch circuit.

FIG. 7 is a circuit diagram showing an example of the data latch circuit. In FIG. 7, one of the data latch circuits DL1 to DLm is shown.

As shown in FIG. 7, in the data latch circuit DL, a high voltage system N-channel transistor 114, a sense circuit SLC and data latches LC[A] to LC[H] corresponding to the sections [A] to [H] are arranged.

The global bit line GBL is connected to one end of the current path of the high voltage system N-channel transistor 114. The other end of the current path of the high voltage system N-channel transistor 114 is connected to one end of the current path of a VCC system N-channel transistor 115. The high voltage transistor 115 is arranged in a region other than the cell well regions 101, 102 and arranged in the P-type semiconductor substrate 100, for example. The transistor 115 is arranged in opposition to the memory cell array 103 with the high voltage transistor 114 disposed therebetween.

The potential of the gate electrode of the high voltage transistor 114 is controlled to be set to the high level to set the high voltage transistor 114 into the conductive state at the read operation time and programming operation time and controlled to be set to 0V, for example, to set the high voltage transistor 114 into the nonconductive state at the erase operation time. The high voltage transistor 114 is a so-called isolation transistor which is used to prevent a high voltage of approximately 20V, for example, supplied to the global bit line GBL via the cell P-type well region 102 and cell N-type well region 101 from being transmitted to the internal portion of the data latch circuit DL at the erase operation time. Therefore, for example, the size of the high voltage transistor 114 is made larger than the size of another transistor such as a VCC transistor in the data latch circuit DL. The channel length of the high voltage transistor 114 is at least six times the channel length of the VCC transistor, for example.

The gate electrode of the transistor 115 is supplied with a preset voltage between the power supply voltage VCC and 0V to control charge voltage of the global bit line GBL at the read operation time and is supplied with the power supply voltage VCC for a preset period of time at the programming operation time.

The other end of the current path of the transistor 115 is connected to programming data latches LC[A] to LC[H] via VCC system N-channel transistors 116[A] to 116[H]. Each of the latches LC[A] to LC[H] includes clocked inverters CLK11 and CLK12. For example, programming data input from the exterior of the chip is input to the latches LC[A] to LC[H] via an I/O data bus and N-channel transistors 117[A] and 117[H] at the programming data input operation time. The latches LC[A] to LC[H] hold input programming data.

Further, the other end of the current path of the transistor 115 is connected to a read sense circuit SLC via a VCC system N-channel transistor 118. The sense circuit SLC includes clocked inverters CLK21 and CLK22. The sense circuit SLC senses the potential of the global bit line GDL and holds sensed readout data at the read operation time, at the verify read operation time in the programming operation, and at the verify read operation time in the erase operation. The thus held data is supplied to the I/O bus via the transistors 118, 116[A] to 116[H], clocked inverters CLK11 in the latches LC[A] to LC[H] and transistors 117[A] to 117[H] then output to the exterior of the memory chip.

Further, the other end of the current path of the transistor 115 is connected to a terminal 121 to which the potential VCC is supplied via a VCC system N-channel transistor 119 and VCC system P-channel transistor 120, for example.

Next, one operation example of the nonvolatile semiconductor memory device according to the first embodiment is explained.

[Read Operation]

In the read operation, the P-channel transistor 120 is rendered conductive to precharge the global bit line GBL to a preset voltage via the N-channel transistors 119, 115, 114. One of the sections [A] to [H] is selected by the section selecting circuit 111 and the section bit line SBL in the selected section is precharged. After this, the potentials of the bit lines SBL, GBL are changed depending on whether the memory cell selected by the row decoder is turned ON or OFF in the selected section. One concrete example is that the gate potential of the transistor 115 is controlled to be set at 1.6V, for example, and the bit lines GBL, SBL are precharged to 1V, for example. Then, if the memory cell is turned ON to permit a preset current (for example, 100 mV) to flow, the potentials of the bit lines GBL, SBL are lowered to 0.9V, for example. The potential of a node 122 of the transistors 115 and 119 is set to a value (for example, 2.4V) which is lower than the gate potential (for example, VCC) of the transistor 119 by the threshold voltage of the transistor 119 after the GBL/SBL precharge operation. When the potential of the line GBL is lowered to 0.9V, the potential of the node 122 is lowered to 0.9V which is the same as the potential of the line GBL. Further, when the memory cell is turned OFF to prevent a preset current from flowing, the potentials of the bit lines GBL, SBL is held at the precharge potential of 1V. Therefore, the transistor 115 is kept in the OFF state and the potential of the node 122 is kept holding at 2.4V.

The clocked inverter CLK22 in the sense circuit SLC senses the potential state of the line GBL by rendering the transistor 118 conductive and then renders the clocked inverter CLK21 conductive to hold the readout data in the sense circuit SLC as "1" or "0" data. After this, the data is transferred to the data latch among the data latches LC[A] to LC[H] which corresponds to the selected section via one of the transistors 116[A] to 116[H].

[Program Operation]

As is well known in the art, a programming system of the NAND nonvolatile semiconductor memory device is carried out by injecting electrons in the channel into the floating gate FG through a tunneling insulation film.

In this example, when "0" data is programmed, for example, 0V is transferred from the global bit line GBL to the section bit line SBL and the transferred voltage 0V is further transferred from the section bit line SBL to the channel of the selected cell transistor CT. For example, a voltage of VCC is applied to the gates of the block selection transistors STD, STS in the selected NAND string, a voltage of approximately 10V is applied to the control gate CG of the non-selected cell transistor CT in the selected NAND string, and a voltage of approximately 20V is applied to the control gate CG of the selected cell transistor CT in the selected NAND string so as to transfer 0V to the channel of the selected cell transistor CT. As a result, electrons are injected into the floating gate FG of the selected cell transistor CT to program "0" data.

Further, when "1" data is programmed, for example, VCC is transferred from the global bit line GBL to the section bit line SBL. A voltage of VCC is applied to the gates of the block selection transistors STD, STS in the selected NAND string. Therefore, the potential difference between the gate and source (section bit line SBL) of the block selection transistor STD becomes equal to or lower than a threshold voltage Vth to render the block selection transistor STD nonconductive. As a result, the channel of the cell transistor CT in the selected NAND string is set into an, electrically floating state and the potential of the channel of the selected NAND string is raised by the capacitive coupling with the potential of the control gate CG of the NAND string. As the result of a rise in the channel potential, the potential difference between the channel of the selected cell transistor CT and the control gate CG is reduced in comparison with that occurring in the case of "0" data programming operation and no electron is injected into the floating gate FG of the selected cell transistor CT. As a result, data of the selected cell transistor, is held at "1" data which corresponds to the erase state.

In the programming operation, first, programming data is stored into the data latch LC from the exterior of the chip via the I/O bus line and transistor 117, for example. When data items are simultaneously programmed into eight pages of the eight sections, the programming data inputting operation is repeated eight times. In the respective inputting operations, the transistors 117[A] to 117[H] are sequentially rendered conductive to permit programming data items to be stored into the corresponding data latches LC[A] to LC[H]. In the "0" data programming, a node 123 is set to the "HIGH" level and a node 124 is set to the "LOW" level. When the programming operation is started, one of the transistors 116[A] to 116[H] and the transistors 115, 114 are set into the conductive state so as to permit the programming data held in the node 124 to be transferred to the channel of the selected cell transistor via the lines GBL, SBL.

Thus, the programming data is transferred to the global bit line GBL in pulse-like by sequentially setting the transistors 116[A] to 116[H] into the conductive state in pulse-like. While the respective pulses are being output, the section selection transistors SST[A] to SST[H] are rendered conductive to permit the programming data to be transferred from the global bit line GBL to the section bit lines SBL[A] to SBL[H].

After the end of the programming operation, the verify read operation is performed to check whether the threshold voltage of the cell transistor rises to a preset value or not.

In a verify read operation, the transistors 116[A] to 116[H] are set into the nonconductive state, the transistor 118 is set into the conductive state and the same operation as the above read operation is performed by use of the sense circuit SLC. As a result, if the threshold voltage of the cell transistor has not risen to the preset value and a current flows into the lines GBL, SBL, a "LOW" level is stored in a node 125. Then, based on the result of the above verify operation, a determination operation is automatically performed in the chip, to decide whether a next additional programming operation should be performed or not. At this time, the clocked inverter CLK21 is set into the nonconductive state and the clocked inverter CLK22 is set into the conductive state. For example, assume that the verify read operation is performed for the section [A]. In this case, the transistor 127[A] among the transistors 127[A] to 127[H] is set in the conductive state. However, since a node 125 is set at the "LOW" level, the transistors 126[A] to 126[H] are kept in the nonconductive state and a node 123 of the data latch LC[A] holds the previous potential according to the charges stored in the capacitor C. That is, it is kept at the "HIGH" level and the node 124 is set to the "LOW" level. After this, the clocked inverter CLK11 is set into the conductive state and the "LOW" level of the node 124 is stored into the data latch LC[A]. In this state, the additional programming operation is performed. In the additional programming operation, a so-called step-up programming operation in which the potential of the word line WL is set higher than that used in the preceding cycle by a preset potential can be used.

Further, in a case wherein the threshold voltage of the selected cell transistor is raised to a preset voltage and no current is permitted to flow through the selected cell transistor, a "HIGH" level is stored into the node 125. Then, like in the verify read operation, the clocked inverter CLK21 is set into the nonconductive state and the-clocked inverter CLK22 is set into the conductive state. At this time, the node 125 is set to the "HIGH" level. For example, when the verify read operation is performed for the section [A], the transistors 127[A] and transistors 126[A] to 126[H] are set into the conductive state. Then, the potential of the node 123 of the data latch LC[A] is inverted to the "LOW" level and the potential of the node 124 is inverted to the "HIGH" level. After this, the clocked inverter CLK11 is set into the conductive state and the "HIGH" level of the node 124 is stored into the data latch LC[A]. Even if the additional programming operation is performed in this state, no data is programmed since VCC is supplied to the lines GBL, SBL.

Figure 8:
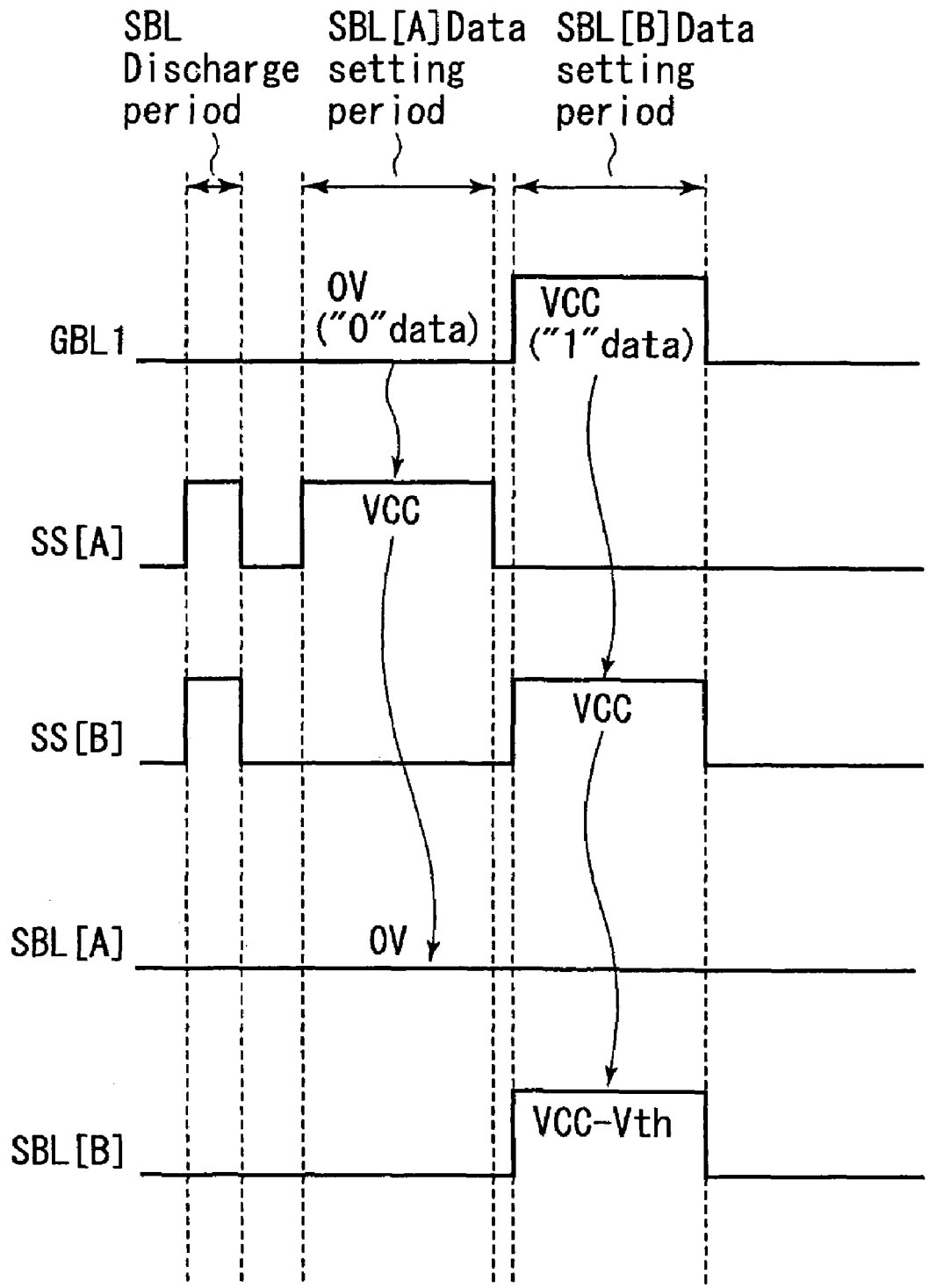
FIG. 8 is an operation waveform diagram showing an example of the programming operation of the nonvolatile semiconductor memory device according to the first embodiment of this invention.

FIG. 8 shows an example of the operation of transferring program data to the section bit line SBL. In order to clarify the explanation, a case wherein data items are simultaneously programmed into two pages of the two sections is explained. In this operation example, "0" data is programmed into a cell transistor CT which is contained in the NAND string of the section [A] on the nth address column and selected by use of a desired word line, and "1" data is programmed into a cell transistor CT which is contained in the NAND string of the section [A] on the same nth address column and selected by use of a desired word line.

As shown in FIG. 8, the global bit line GBL is set to the "LOW" level (for example, 0V) and the section selection lines SS[A], SS[B] are set to the "HIGH" level (for example, VCC) so as to discharge all of the section bit lines SBL[A], SBL[B], for example, to initialize them to 0V (in an SBL discharge period).

Next, the section selection line SS[A] is set to the "HIGH" level and the section selection line SS[B] is kept at the "LOW" level. At the same time, or before or after the above operation, programming data to be programmed into the section bit line SBL[A] is transferred from the data latch LC[A] to the line GBL. As a result, a programming potential used to program "0" data, for example, 0V, is set to the section bit line SBL[A] (in an SBL[A] data setting period).

Next, the section selection line SS[A] is set to the "LOW" level and the section selection line SS[B] is set to the "HIGH" level so as to isolate the section bit line SBL[A] from the line GBL and connect the section bit line SBL[B] to the line GBL. At the same time, or after the above operation, programming data to be programmed into the section bit line SBL[B] is transferred from the data latch LC[B] to the line GBL. As a result, a programming potential used to program "1" data, for example, VCC−VthV volt, is set in the section bit line SBL[B] (in an SBL[B] data setting period). In this period, "0" data is programmed into a cell transistor CT contained in the NAND string of the section [A] and selected by use of a desired word line.

In the verify read operation after the programming operation, determination as to whether the programming operation is successfully performed or not is made by use of the sense circuit SLC.

Pages subjected to the programming operation are sequentially selected and data items of the data latches LC[A], LC[B] in which programming data is stored are reexamined for each cycle based on the verify result latched in the sense circuit SLC. If the programming data amount is sufficient (succeeded in the programming), programming data stored in the data latch LC corresponding to the page is changed to "1" data. On the other hand, if the programming data amount is insufficient, first programming data is stored into the corresponding data latch circuit LC and the programming operation is performed again according to the first programming data in the next cycle.

[Erase Operation]

In the erase operation, the cell P-type well region 102 is set to 20V, for example, and all of the word lines WL in the selected block are set to 0V. Thus, electrons are discharged from the floating gate FG of the cell transistor CT to set the threshold voltage thereof to a negative value and a "1" data state is set. At this time, the word lines WL, global bit line GBL, and section selection line SS in the non-selected block are set into an electrically floating state. As a result, the word lines WL, global bit line GBL, and section selection line SS in the non-selected block are set closer to 20V by the capacitive coupling with the cell P-type well region 102 in the erase operation. As described above, in this example, the global bit line GBL is set into the electrically floating state by setting the high voltage-transistor 114 into the nonconductive state, and the section selection line SS is set into the electrically floating state by setting the high voltage transistor 112 into the nonconductive state.

According to the nonvolatile semiconductor memory device of the first embodiment, the bit lines are divided into the global bit lines GBL and section bit lines SBL and charges stored in the section bit line SBL are used for data programming. Thus, it becomes possible to simultaneously programming data items into a plurality of sections which are connected to the same global bit line. Further, the data latch circuit DL is not divided for each of the plural sections and can be commonly used by the plurality of sections. Therefore, the scale of the data latch circuit DL can be reduced. Thus, the programming operation speed can be enhanced while an increase in the scale of the data latch circuit DL is suppressed.

For example, in the data latch circuit DL of the nonvolatile semiconductor memory device according to the first embodiment, the data latch LC which latches programming data is provided for each set of plural sections, but the sense circuit SLC and high voltage transistor 114 can be commonly used by the plurality of sections. Further, for example, the number of memory cell arrays of the nonvolatile semiconductor memory device according to the first embodiment can be set to one.

Figure 1:
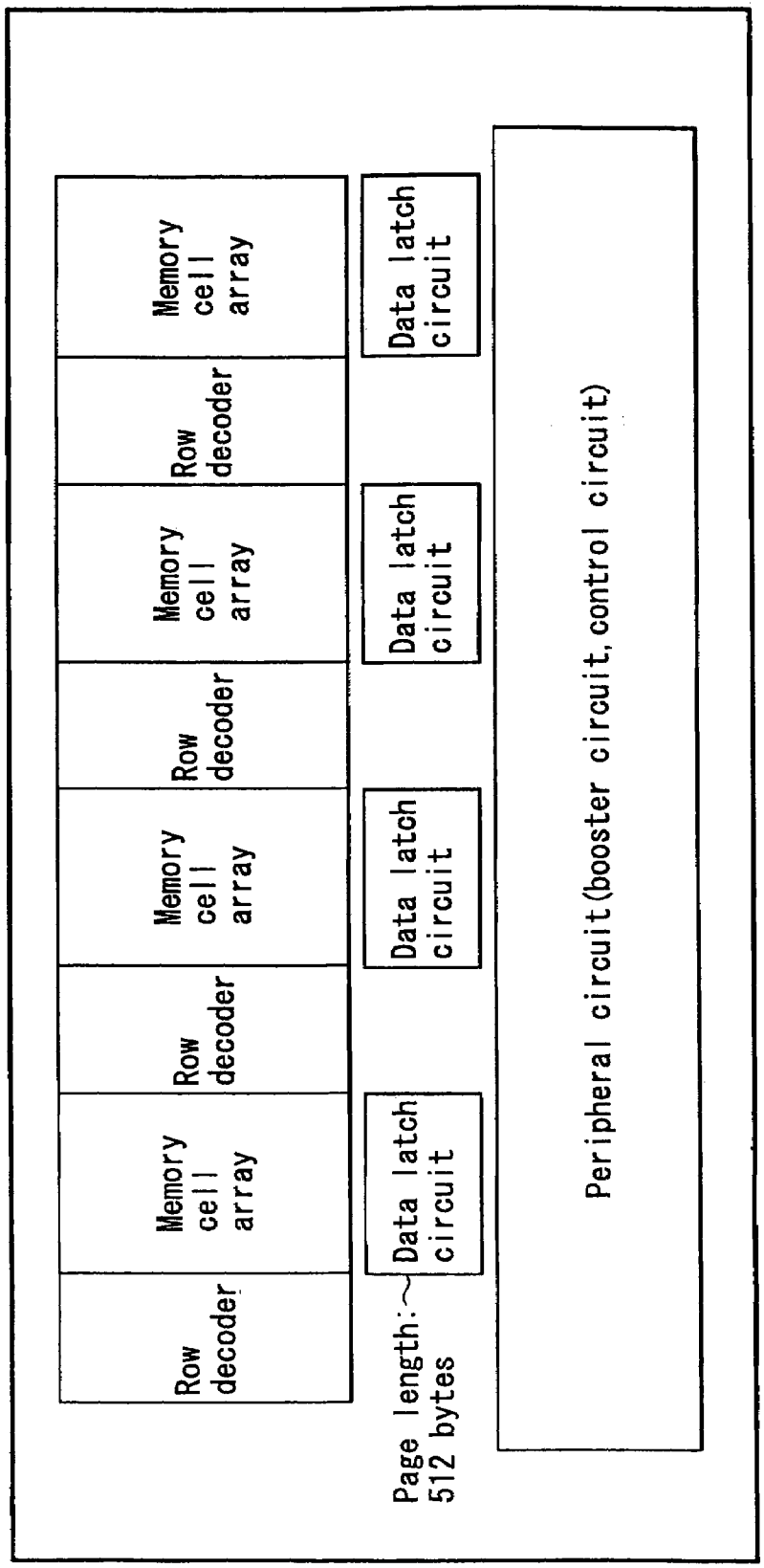
FIG. 1 is a plan view showing a typical conventional nonvolatile semiconductor memory device.

One example of a reduction in the number of data latch circuits DL, a reduction in the number of sense circuits SLC in the circuit DL, a reduction in the number of high voltage transistors in the circuit DL, and a reduction in the number of memory cell arrays for the nonvolatile semiconductor memory device shown in FIG. 1 are as follows.

In the case of page length 512 bytes×8 (4 Kbytes=32 Kbits)
[nonvolatile semiconductor memory device shown in FIG. 1]
The number of data latch circuits DL: 8
The number of sense circuits: 512 bytes×8
The number of high voltage transistors: 512 bytes×8
The number of memory cell arrays: 8
[nonvolatile semiconductor memory device according to the first embodiment (the number of sections is eight)]
The number of data latch circuits DL: 1
The number of sense circuits: 512 bytes×1
The number of high voltage transistors: 512 bytes×1
The number of memory cell arrays: 1

As described above, each of the number of data latch circuits DL, the number of sense circuits, the number of high voltage transistors, and the number of memory cell arrays are reduced.

One example of a reduction in the number of data latch circuits DL, a reduction in the number of sense circuits SLC in the circuit DL, a reduction in the number of high voltage transistors in the circuit DL, and a reduction in the number of memory cell arrays for a nonvolatile semiconductor memory device disclosed in a non-patent document 1 are as follows.

In the case of page length 512 bytes×8 (4 Kbytes=32 Kbits)
[nonvolatile semiconductor memory device disclosed in the non-patent document 1]
The number of data latch circuits DL: 4
The number of sense circuits: 512 bytes×4 (in this case, the sense circuit is commonly used by the upper bank and lower bank)
The number of high voltage transistors: 512 bytes×8
The number of memory cell arrays: 8
[nonvolatile semiconductor memory device according to the first embodiment (the number of sections is eight)]
The number of data latch circuits DL: 1
The number of sense circuits: 512 bytes×1
The number of high voltage transistors: 512 bytes×1
The number of memory cell arrays: 1

In either case, according to the nonvolatile semiconductor memory device of the first embodiment, the number of data latch circuits DL, the number of sense circuits, the number of high voltage transistors, and the number of memory cell arrays are reduced.

Further, in the configuration in which the data latch circuits are arranged between the upper bank and the lower bank, as described in the non-patent document 1, it is necessary to arrange high voltage transistors, which separate the data latch circuit from the bit lines, between the data latch circuit and the upper bank and between the data latch circuit and the lower bank in the erase operation. The high voltage transistor is large. This is because no punchthrough occurs even when high voltage is applied thereto. For example, the channel length thereof is six times the channel length of the VCC transistor. There occurs a problem that it is difficult to reduce the number of such high voltage transistors with a large size.

On the other hand, according to the nonvolatile semiconductor memory device of the first embodiment, the number of high voltage transistors can be reduced since the high voltage transistor can be commonly used by a plurality of sections.

It is necessary to form the high voltage transistors in a region outside the cell N-type well region, for example, in the P-type semiconductor substrate. The cell N-type well region is a region which separates the cell P-type well region from the P-type semiconductor substrate, and therefore, it is formed with large in width and in depth. As a result, a lateral diffusion of the cell N-type well tends to become larger and a dead space tends to increase on the chip surface.

On the other hand, according to the nonvolatile semiconductor memory device of the first embodiment, the number of memory cell arrays can be set to one. When the number of memory cell arrays is set to one, the area of the dead space which is caused by the lateral diffusion of the cell N-type well region can be reduced in comparison with a case wherein the memory cell arrays are disposed one on each of the upper side and lower side of the data-latch circuit.

Next, a device applied to the nonvolatile semiconductor memory device of the first embodiment is explained as a modification of the first embodiment. The device is related to a method for suppressing an increase in the area of the memory cell array.

In the first embodiment, the source/drain diffusion layer 106DD of the section selection transistor SST[A] is also used as the source/drain diffusion layer 106DD of the section selection transistor SST[B] in the sections which commonly use the section selection circuit 111, for example, the sections [A] and [B] and the global bit line GBL is set in contact with the commonly used diffusion layers 106DD. Thus, the number of contacts with the global bit line GBL can be reduced, the distance between the sections can be reduced and an increase in the area of the memory cell array can be suppressed.

Further, in the first embodiment, a device is made for a portion between the sections which do not commonly use the section selection circuit 111, for example, the sections [B] and [C]. The device is to commonly use the source line SL in a boundary portion between the sections [B] and [C].

Figures 9A, 9B:
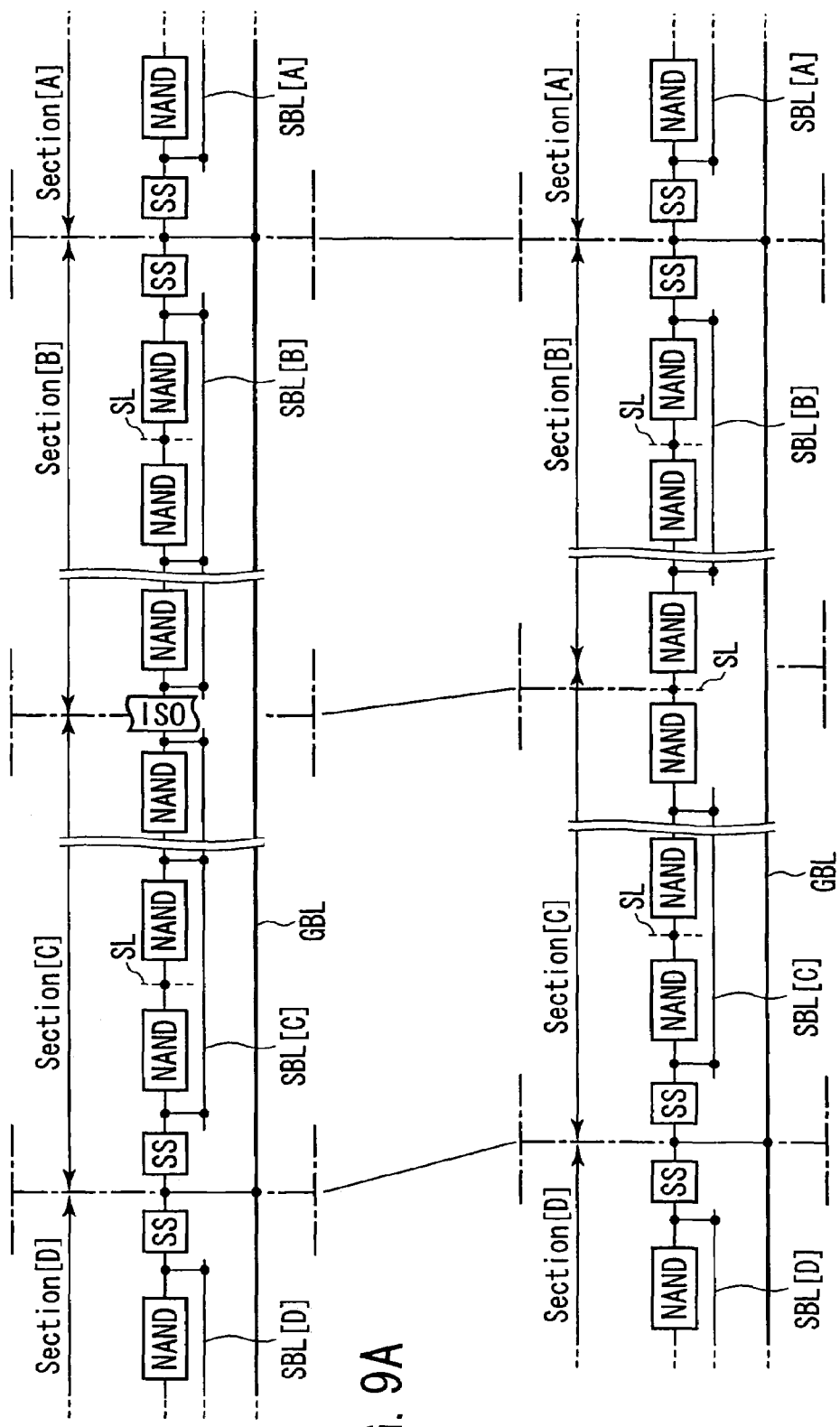
FIG. 9A is a configuration diagram showing a first modification of the nonvolatile semiconductor memory device according to the first embodiment of this invention.
FIG. 9B is a configuration diagram showing a second modification of the nonvolatile semiconductor memory device according to the first embodiment of this invention.

FIG. 9A shows one example of the state of isolation between the sections [B] and [C] and FIG. 9B shows another example of the state of isolation between the sections [B] and [C].

In the first example shown in FIG. 9A, isolation between the sections [B] and [C] is attained by use of an isolation region ISO. One example of the structure of this case is shown in FIGS. 10A, 10B.

Figure 10A:
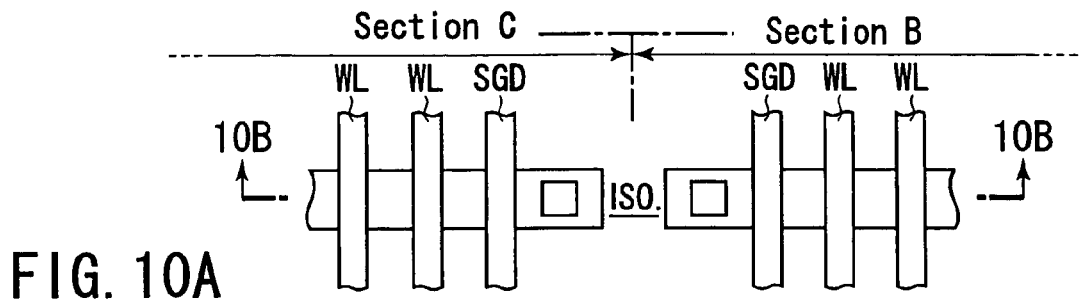
FIG. 10A is a plan view showing an example of the plane pattern of the nonvolatile semiconductor memory device according to the first modification of the first embodiment.
Figure 10B:
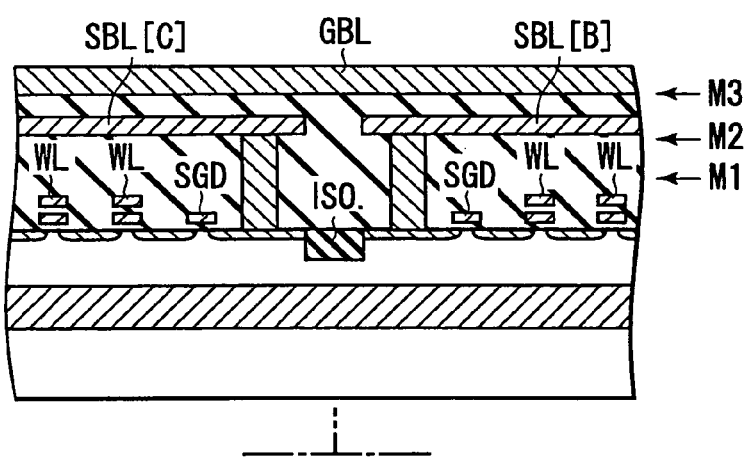
FIG. 10B is a cross sectional view taken along the 10B-10B line of FIG. 10A.

FIG. 10A is a plan view and FIG. 10B is a cross sectional view taken along the 10B-10B line of FIG. 10A.

As shown in FIGS. 10A and 10B, when the sections [B] and [C] are isolated from each other by use of the isolation region ISO., for example, an isolation region ISO, formed of an insulating material is formed between the source/drain diffusion layer 106D of the drain-side block selection transistor STD[B] and the source/drain diffusion layer 106D of the drain-side block selection transistor STD[C].

In a second example shown in FIG. 9B, the source line SL is commonly used by the sections [B] and [C]. One example of this structure is shown in FIGS. 11A and 11B.

Figure 11A:
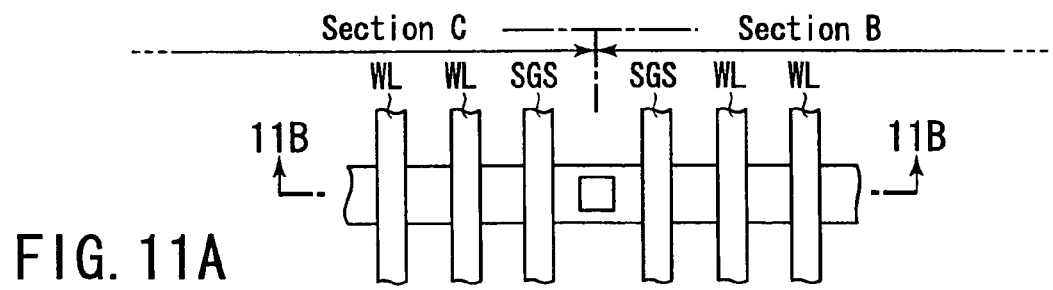
FIG. 11A is a plan view showing an example of the plane pattern of the nonvolatile semiconductor memory device according to the second modification of the first embodiment.
Figure 11B:
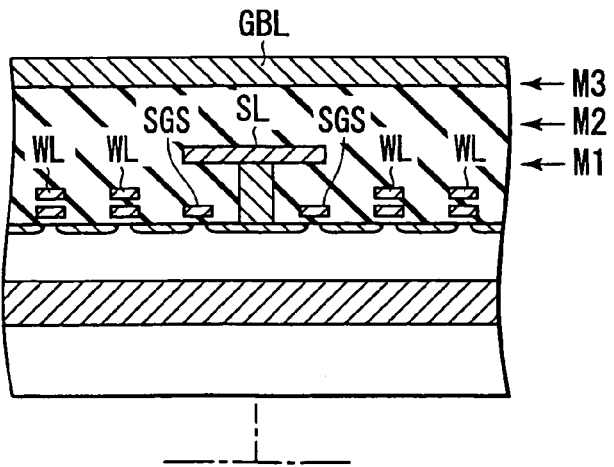
FIG. 11B is a cross sectional view taken along the 11B-11B line of FIG. 11A.

FIG. 11A is a plan view and FIG. 11B is a cross sectional view taken along the 11B-11B line of FIG. 11A.

As shown in FIGS. 11A and 11B, when the sections [B] and [C] commonly use the source line SL, for example, the source/drain diffusion layer 106S of the source-side block selection transistor STS[B] and the source/drain diffusion layer 106S of the source-side block selection transistor STS[C] can be commonly used. Therefore, it becomes unnecessary to form the isolation region between the source/drain diffusion layers 106S and the distance between the sections [B] and [C] can be further reduced in comparison with the first example shown in FIGS. 9A, 10A and 10B.

Thus, when the distance between the sections which do not commonly use the section selecting circuit 111 is reduced and it is desired to reduce an increase in the area of the memory cell array or enhance the integration density of the memory cell array, the second example shown in FIGS. 9B, 11A and 11B can be used.

Of course, one of the first and second examples can be freely and selectively used and can be adequately selected. For example, in the first example, the NAND string at the end portion ends at the transistor STD and, in the second example, the NAND string at the end portion ends at the transistor STS. Therefore, for example, the number of NAND strings for each column is changed in one section. For example, the number of NAND strings becomes even or odd. Since a difference occurs in the design of the integrated circuit, for example, which of the first and second example is used can be adequately determined according to the situation.

The modifications shown in FIGS. 9, 10, 11 can be applied to other embodiments which will be described later.

SECOND EMBODIMENT

Figure 12:
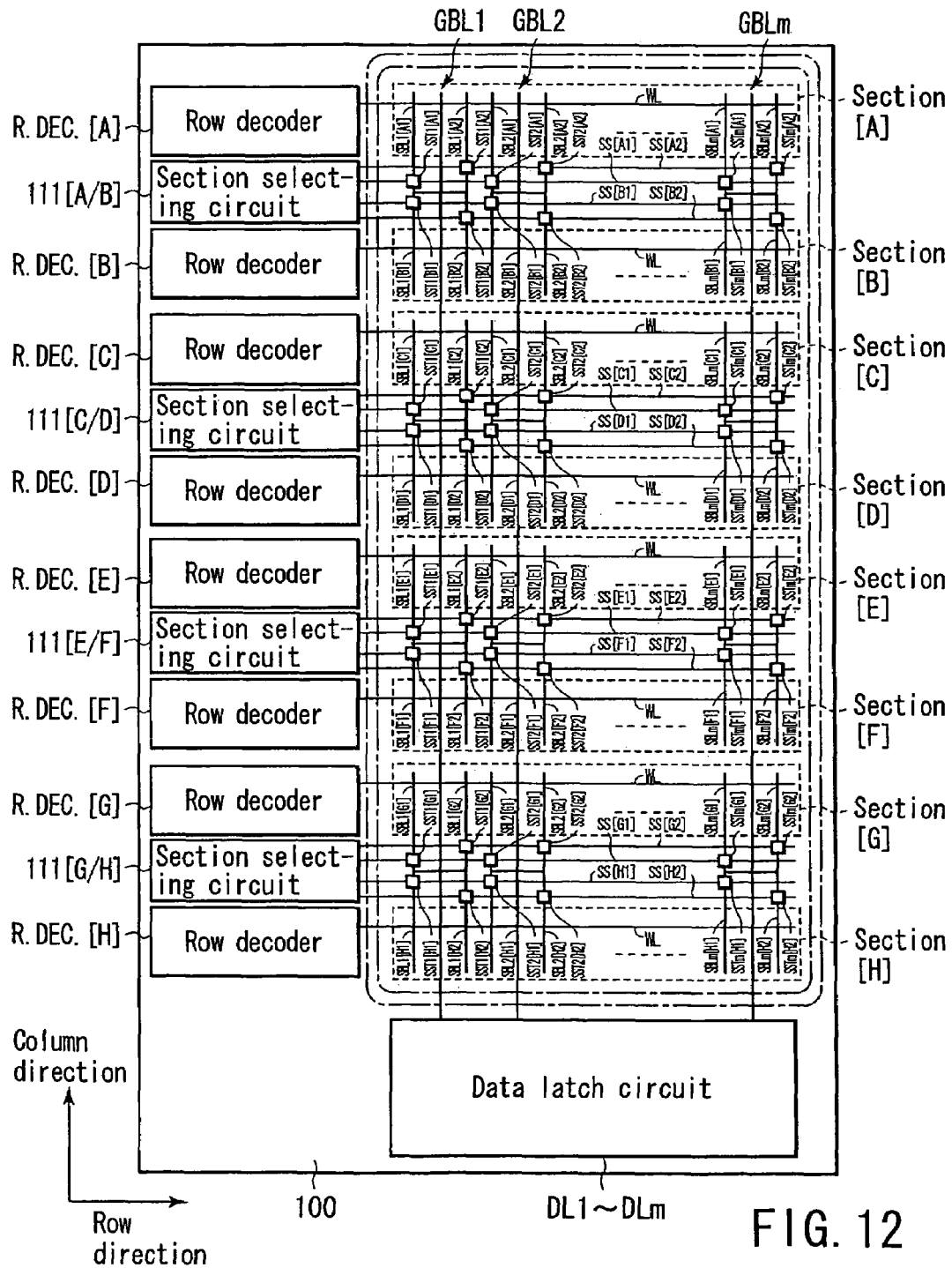
FIG. 12 is a block diagram showing an example of the configuration of a nonvolatile semiconductor memory device according to a second embodiment of this invention.

FIG. 12 is a block diagram showing an example of the configuration of a nonvolatile semiconductor memory device according to a second embodiment of this invention.

As shown in FIG. 12, the nonvolatile semiconductor memory device according to the second embodiment is different from that of the first embodiment in that four section selection transistors SST[A1], SST[A2], SST[B1], SST[B2] are arranged between sections [A] and [B], for example. One global bit line GBL is connected to odd-numbered addresses SBL1[A1], SBL3[A1], . . . of the section [A] via the transistors SST1[A1], SST3[A1], . . . and connected to even-numbered addresses SBL2[A2], SBL4[A2], . . . of the section [A] via the transistors SST2[A2], SST4[A2], . . . . Further, the same line GBL is connected to odd-numbered addresses SBL1[B1], SBL3[B1], . . . of the section [B] via the transistors SST1[B1], SST3[B1], . . . and connected to the even-numbered addresses SBL2[B2], SBL4[B2], . . . of the section [B] via the transistors SST2[B2], SST4[B2], . . . .

Like the first embodiment, a section selecting circuit 111 is divided into four section selecting circuits 111[A/B], 111[C/D], 111[E/F], 111[G/H]. However, the section selecting circuit 111[A/B] of this embodiment supplies a signal which selects an odd-numbered address SBL of the section [A] to the gates of the transistors SST1[A1], SST3[A1], . . . via a section selection line SS[A1] and supplies a signal which selects an even-numbered address SBL of the section [A] to the gates of the transistors SST2[A2], SST4[A2], . . . via a section selection line SS[A2]. Further, it supplies a signal which selects an odd-numbered address SBL of the section [B] to the gates of the transistors SST1[B1], SST3[B1], . . . via a section selection line SS[B1] and supplies a signal which selects an even-numbered address SBL of the section [B] to the gates of the transistors SST2[B2], SST4[B2], . . . via a section selection line SS[B2]. The same operation as described above is performed in the section selecting circuits 111[C/D], 111[E/F], 111[G/H].

Figure 13:
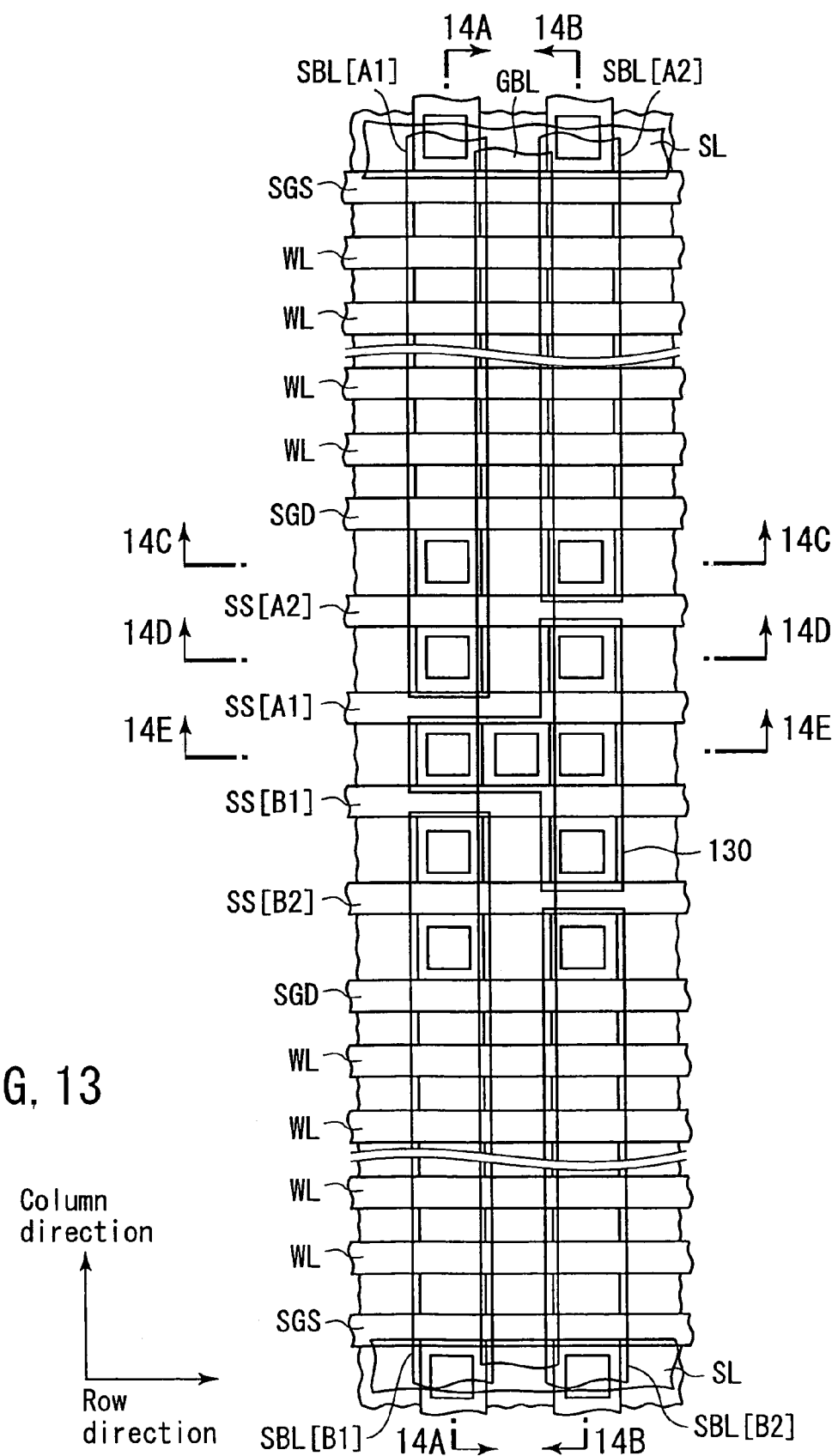
FIG. 13 is a plan view showing an example of the plane pattern of a memory cell array of the memory device according to the second embodiment of this invention.
Figure 14C:
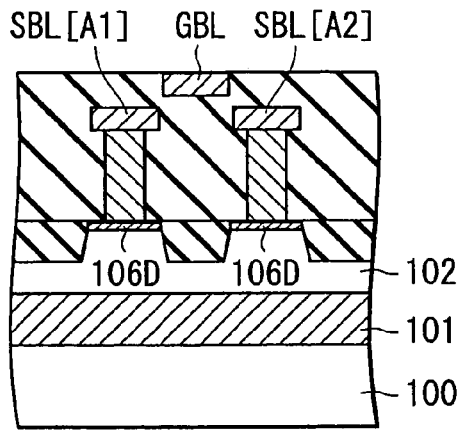
FIG. 14C is a cross sectional view taken along the 14C-14C line of FIG. 13.
Figure 14D:
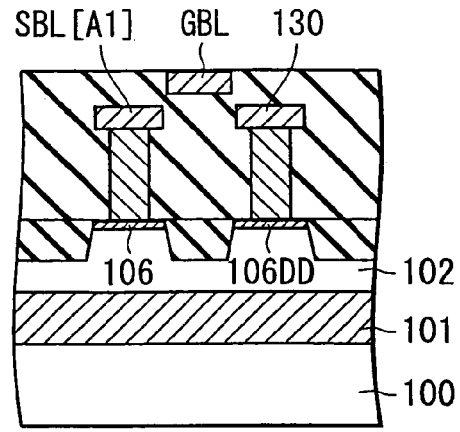
FIG. 14D is a cross sectional view taken along the 14D-14D line of FIG. 13.
Figure 14E:
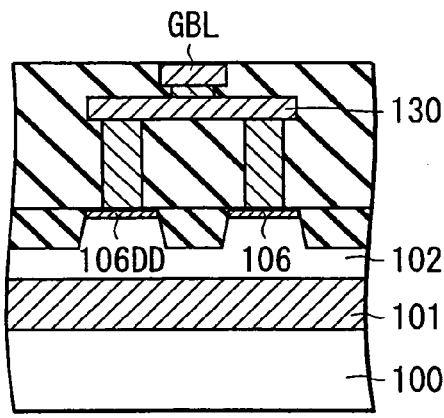
FIG. 14E is a cross sectional view taken along the 14E-14E line of FIG. 13.

FIG. 13 is a plan view showing an example of the plane pattern of a memory cell array of the memory device according to the second embodiment, FIG. 14A is a cross sectional view taken along the 14A-14A line of FIG. 13, FIG. 14B is a cross sectional view taken along the 14B-14B line of FIG. 13, FIG. 14C is a cross sectional view taken along the 14C-14C line of FIG. 13, FIG. 14D is a cross sectional view taken along the 14D-14D line of FIG. 13, and FIG. 14E is a cross sectional view taken along the 14E-14E line of FIG. 13.

As shown in FIGS. 13, 14A to 14E, the configuration of the NAND string is basically the same as that of the first embodiment. The difference between them lies in that a one-column global bit line GBL is provided for every two-column section bit lines SBL. In this example, the section bit line SBL formed by use of a second metal layer is formed under the global bit line formed by use of a third metal layer and the global bit line GBL of one column is arranged above a portion between the section bit lines SBL of two columns.

The advantage obtained by arranging a one-column global bit line GBL for every two-column section bit lines SBL is that the pitch between the lines GBL can be relaxed in comparison with the pitch between the lines SBL or the pitch between word lines of cell transistors CT, for example, and the forming process of the third metal layer, such as the lithography process and etching process, can be performed with a sufficiently large process margin.

Under a portion of the odd-numbered address location in the boundary portion between the sections, a source/drain diffusion layer 106D of a drain-side block selection transistor STD of the section [A] is also used as one of source/drain diffusion layers of a transistor PSST[A1] having a gate formed of the section selection line SS[A2]. The other source/drain diffusion layer 106 of the transistor PSST[A1] is also used as one of source/drain diffusion layers of a section selection transistor SST[A1] having a gate formed of the section selection line SS[A1]. The other source/drain diffusion layer 106DD of the transistor SST[A1] is also used as one of source/drain diffusion layers of a section selection transistor SST[B1] having a gate formed of the section selection line SS[B1]. The other source/drain diffusion layer 106 of the transistor SST[B1] is also used as one of source/drain diffusion layers of a transistor PSST[B1] having a gate formed of the section selection line SS[B2]. The other source/drain diffusion layer 106D of the transistor PSST[B1] is also used as a source/drain diffusion layer of a drain-side block selection transistor STD of the section [B].

Under a portion of the even-numbered address location, a source/drain diffusion layer 106D of a drain-side block selection transistor STD of the section [A] is also used as one of source/drain diffusion layers of a section selection transistor SST[A2] having a gate formed of the section selection line SS[A2]. The other source/drain diffusion layer 106DD of the transistor SST[A2] is also used as one of source/drain diffusion layers of a transistor PSST[A2] having a gate formed of the section selection line SS[A1]. The other source/drain diffusion layer 106 of the transistor PSST[A2] is also used as one of source/drain diffusion layers of a transistor PSST[B2] having a gate formed of the section selection line SS[B1]. The other source/drain diffusion layer 106DD of the transistor PSST[B2] is also used as one of source/drain diffusion layers of a section selection transistor SST[B2] having a gate formed of the section selection line SS[B2]. The other source/drain diffusion layer 106D of the transistor SST[B2] is also used as a source/drain diffusion layer of a drain-side block selection transistor STD of the section [B].

The transistors PSST[A1], PSST[B1] formed in the odd-numbered address locations and the transistors PSST[A2], PSST[B2] formed in the even-numbered address locations are transistors whose gates are formed of the section selection lines SS, but they are not used for section selection. Therefore, the transistors PSST[A1], PSST[B1], PSST[A2], PSST[B2] are short-circuited between the source/drain diffusion layers and are kept in the normally ON state. For this reason, the transistors PSST[A1], PSST[B1], PSST[A2], PSST[B2] are omitted in the block diagram of FIG. 12.

In this example, the transistor PSST[A1] short-circuits its diffusion layers 106D and 106 by use of the odd-numbered address location SBL1[A1] of the section [A]. Likewise, the diffusion layers 106D and 106 of the transistor PSST[B1] are short-circuited by use of the odd-numbered address location SBL1[B1] of the section [B].

Further, a local wiring 130 is formed between the lines SBL[A2] and SBL[B2] by use of the second metal layer used to form the line SBL, for example, and the transistor PSST[A2] short-circuits its diffusion layers 106 and 106DD by use of the local wiring 130. Likewise, the diffusion layers 106 and 106DD of the transistor PSST[B2] are short-circuited by use of the local wiring 130. In this example, since the diffusion layer 106 of the transistor PSST[A2] and the diffusion layer 106 of the transistor PSST[B2] are commonly used, a contact of the diffusion layer 106 with the local wiring 130 is commonly used.

Further, the local wiring 130 is connected to the diffusion layer 106DD of the transistor SST[A2] and the diffusion layer 106DD of the transistor PSST[B2]. By taking this into consideration, the local wiring 130 can function as a wiring used to connect the global bit line GBL to the lines SBL[A1], SBL[A2], SBL[B1] and SBL[B2] by connecting the local wiring 130 to the diffusion layer 106DD of the transistor SST[A1] and the diffusion layer 106DD of the transistor PSST[B1]. In this example, one line GBL is connected to four lines SBL by connecting the local wiring 130 to the diffusion layers 106DD of the transistors SST[A1], SST[A2], SST[B1] and SST[B2] and connecting the line GBL to the local wiring 130.

FIG. 15A is a circuit diagram showing an example of the section selecting circuit 111 of the device according to the second embodiment. In FIG. 15A, the section selecting circuit 111[A/B] is shown and the other section selecting circuits 111[C/D] to 111[G/H] have the same circuit configuration. A NAND string is expressed by a rectangular box and the equivalent circuit in the box is shown in FIG. 15B.

As shown in FIG. 15A, the section selecting circuit 111 of the device according to the second embodiment includes high voltage system N-channel transistors 112[A1], 112[A2], 112[B1], 112[B2] which set the section selection lines SS[A1], SS[A2], SS[B1], SS[B2] into the electrically floating state in the erase operation. Like the first embodiment, a signal ERASE-OFF is supplied to the gate electrodes of the high voltage transistors 112[A1], 112[A2], 112[B1], 112[B2]. The high voltage transistors 112[A1], 112[A2], 112[B1], 112[B2] are turned ON in the programming operation and the read operation and turned OFF in the erase operation.

One of ends of the current paths of the high voltage transistors 112[A1], 112[A2], 112[B1], 112[B2] are connected to the section selection lines SS[A1], SS[A2], SS[B1], SS[B2] and the other ends thereof are connected to global section selection signal lines GS[A1], GS[A2], GS[B1], GS[B2] via buffer inverter circuits 113[A1], 113[A2], 113[B1], 113[B2]. When the odd-numbered address of the section [A] is selected, the potential of the signal line GS[A1] of this example is set to the "LOW" level so as to set the transistor SST[A1] into the conductive state via the inverter circuit 113[A1] and high voltage transistor 112[A1]. Likewise, when the even-numbered address of the section [A] is selected, the potential of the signal line GS[A2] is set to the "LOW" level so as to set the transistor SST[A2] into the conductive state via the inverter circuit 113[A2] and high voltage transistor 112[A2]. Further, when the odd-numbered address of the section [B] is selected, the potential of the signal line GS[B1] is set to the "LOW" level to set the transistor SST[B1] into the conductive state via the inverter circuit 113[B1] and high voltage transistor 112[B1], and when the even-numbered address of the section [B] is selected, the potential of the signal line GS[B2] is set to the "LOW" level to set the transistor SST[B2] into the conductive state via the inverter circuit 113[B2] and high voltage transistor 112[B2].

Next, one operation example of the nonvolatile semiconductor memory device according to the second embodiment is explained.

[Read Operation]

In the first embodiment, the entire data items of the even/odd-numbered addresses are simultaneously read out irrespective of the address of the line SBL. For example, the second embodiment is basically the same as the first embodiment except that each word line WL is connected to the memory cells of two pages, data of the even-numbered address (of one page) is read out when the address of the line SBL is even and data of the odd-numbered address (of the other page) is read out when the address of the line SBL is odd.

The advantage obtained by performing the data read operation separately for the even- and odd-numbered addresses is that the adjacent section bit lines SBL can be set to 0V, for example, in the data read operation. Thus, the precision of data readout to the section bit line SBL can be enhanced.

[Program Operation]

Figure 16:
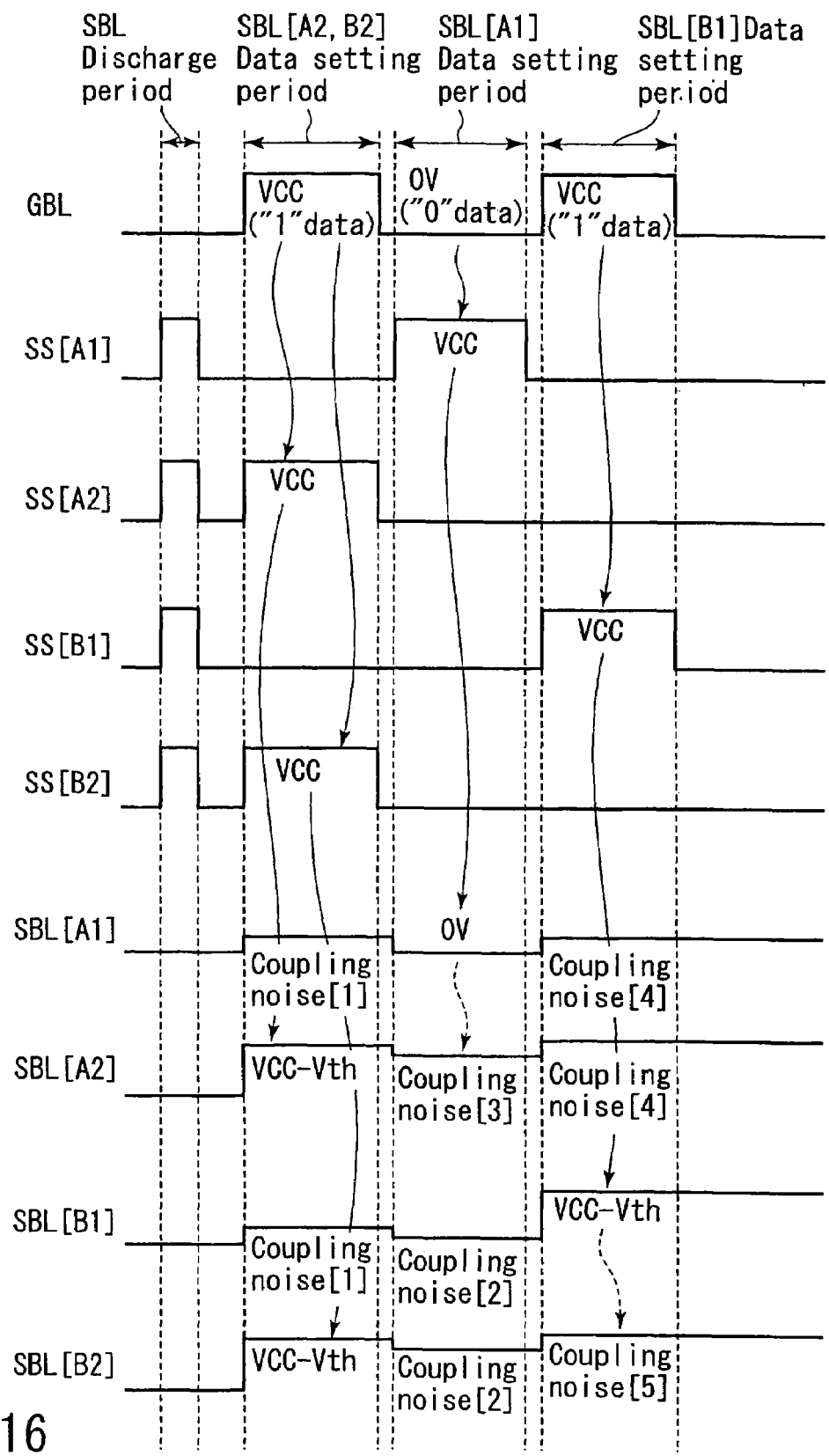
FIG. 16 is an operation waveform diagram showing an example of the programming operation of the nonvolatile semiconductor memory device according to the first embodiment of this invention.

In the second embodiment, for example, each word line WL is connected to the memory cells of two pages. Therefore, in order to programming data of one page, the memory cells of the adjacent section bit lines SBL (of the next page address) are set into the non-selected state for programming. As a result, for example, "1" data is programmed into the memory cells of the column addresses (n−1) and (n+1) adjacent to the column address n via the lines GBL, SBL. For example, a potential which sets the transistor into the non-selected state for programming, for example, the potential VCC is applied to the channel of the cell transistor CT which lies in the NAND strings [A2], [B2] of the column address (n+1) shown in FIG. 15A and is connected to the word line WL selected for programming via the lines GBL, SBL. The potential VCC is supplied from the data latch circuit DL. In order to supply the potential VCC to the line SBL of the column address (n+1), the potential VCC is supplied to the line GBL. In order to supply the potential VCC to the line GBL, a potential of 0V is applied to the gate electrode of the VCC system P-channel transistor 120 in the data latch circuit DL shown in FIG. 7 and a potential of (VCC+Vth) which is higher than the potential VCC by the threshold voltage. Vth of the VCC system N-channel transistor 119 is applied to the gate electrode of the VCC system N-channel transistor 119. Then, the node 122 may be set to the potential VCC and transferred to the line GBL via the transistors 115, 114. One operation example is shown in FIG. 16. In order to clarify the explanation, a case wherein data items are simultaneously programmed into two pages of the two sections is explained.

As shown in FIG. 16, the section selection lines SS[A1], SS[A2], SS[B] are set to the "HIGH" level (for example, VCC) and the global bit line GBL is set to the "LOW" level (for example, 0V) so as to discharge all of the section bit lines SBL[A1], SBL[B1], SBL[A2], SBL[B2], for example, initialize them to 0V (in the SBL discharge period).

Next, the section selection lines SS[A2], SS[B2] are set to the "HIGH" level (in the SBL[A2, B2] data setting period) in order to turn ON the section selection transistors SST [A2], SST[B2] of the bit lines SBL[A2], SBL[B2] which are adjacent to the lines SBL[A1], SBL[B1] corresponding to the page to be programmed.

Figure 17:
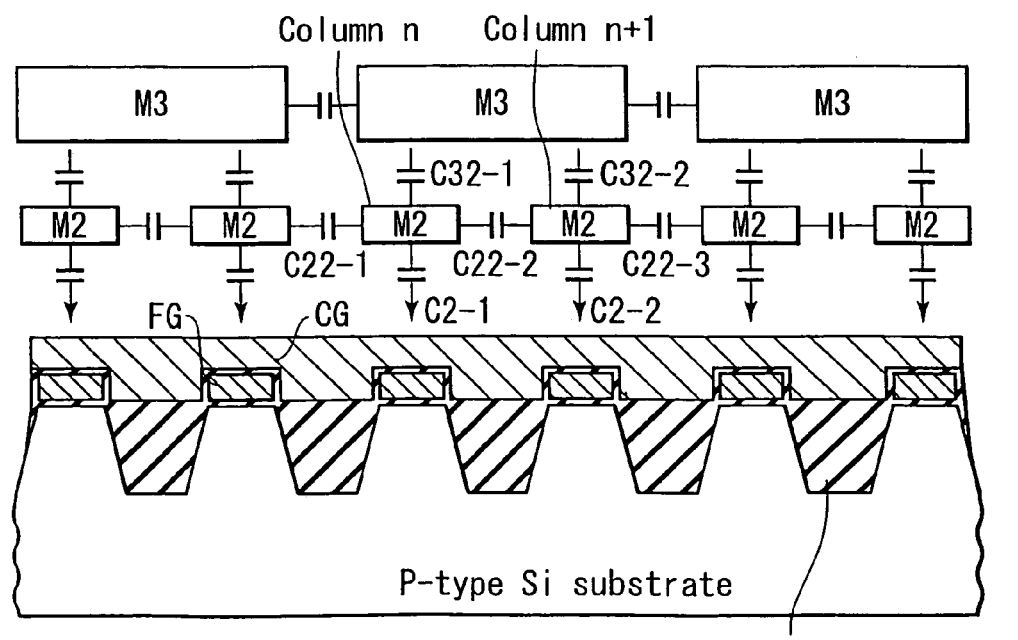
FIG. 17 is a diagram showing parasitic capacitances associated with a section bit line.

At this time, the potential VCC corresponding to "1" data is applied to the line GBL via the transistors 120, 119. As a result, the potential (VCC−Vth) is applied to the lines SBL[A2] and SBL[B2]. Further, since the lines SBL[A1], SBL[B1] are set in the electrically floating state, the potentials of the lines SBL[A1], SBL[B1] are raised by several hundred mV (coupling noise [1] in FIG. 16) by the action of parasitic capacitors C32-1, C22-1, C22-2 shown in FIG. 17.

Next, the section selection line SS[A1] is set to the "HIGH" level so as to supply "0" data from the line GBL to the section bit line SBL[A1] in the section [A] (in the SBL[A1] data setting period). At this time, the potential 0V corresponding to "0" data is supplied from the data latch circuit DL to the line GBL. As a result, 0V is supplied to the line SBL[A1].

Further, since the lines SBL[A2], SBL[B1], SBL[B2] are set in the floating state, they are influenced by the capacitive coupling. The lines SBL[B1], SBL[B2] are difficult to be influenced by the capacitive coupling with the line SBL [A1], but the potentials of the lines SBL[B1], SBL[B2] are lowered by several hundred mV by the influence of the parasitic capacitors C32-1, C32-2 mainly associated with the line GBL (coupling noise [2] in FIG. 16). Further, the line SBL[A2] is influenced by the capacitive coupling with the adjacent lines SBL in addition to the capacitive coupling with the line GBL. When the adjacent lines SBL are used for "0" data programming, the potential of the line SBL[A2] is lowered by several hundred mV and more by the influence of the parasitic capacitors C32-1, C22-2, C22-3 shown in FIG. 17 (coupling noise [3] in FIG. 16).

Next, the section selection line SS[B1] is set to the "HIGH" level so as to supply "0" data from the line GBL to the section bit line SBL[B1] in the section [B] (in the SBL[B1] data setting period). At this time, the potential VCC corresponding to "1" data is supplied from the data latch circuit DL to the line GBL. As a result, the potential (VCC−Vth) is supplied to the line SBL[B1].

Further, since the lines SBL[A1], SBL[A2], SBL[B2] are set in the floating state, they are influenced by the capacitive coupling. The potentials of the lines SBL[A1], SBL[A2] are raised by several hundred mV by the influence of the parasitic capacitors C32-1, C32-2 mainly associated with the line GBL (coupling noise [4] in FIG. 16). Further, the line SBL[B2] is influenced by the capacitive coupling with the adjacent lines SBL in addition to the capacitive coupling with the line GBL. When the adjacent lines SBL are used for "1" data programming, the potential of the line SBL[A2] is raised by several hundred mV and more by the influence of the parasitic capacitors C32-1, C22-2, C22-3 shown in FIG. 17 (coupling noise [5] in FIG. 16).

According to the above operation example, a fluctuation in programming data of the line SBL due to the coupling noise can be suppressed by, first, transferring potential which sets the non-selected state for programming to the lines SBL[A2], SBL[B2] of a non-selected page and then transferring the programming data to the lines SBL[A1], SBL[B1] of a selected page.

Further, when the programming non-selection potential (VCC−Vth) is lowered by several hundred mV and more by the coupling noise to cause data to be erroneously programmed into a memory cell, it can be improved by setting the "HIGH" level potential of the section selection line SS and block selection lines SGD, SGS to a voltage higher than VCC.

In the verify read operation after the programming operation, determination, whether the programming operation is successfully performed or not is made by the sense circuit SLC.

Pages subjected to the programming operation are sequentially selected and data items of the data latches LC[A], LC[B] in which programming data is stored are reexamined for each cycle based on the verify result latched in the sense circuit SLC. If the programming data amount is sufficient (successful in programming), programming data stored in the data latch LC corresponding to the page is changed to "1" data. On the other hand, if the programming data amount is insufficient, the first programming data is stored into the corresponding data latch circuit LC and the programming operation is also performed based on the first programming data in the next cycle.

[Erase Operation]

The erase operation of the device according to the second embodiment is basically the same as the erase operation of the first embodiment.

Like the first embodiment, in the nonvolatile semiconductor memory device according to the second embodiment, the bit lines are divided into the lines GBL, SBL and charges stored in the line SBL are used for data programming. Therefore, the same advantage as that obtained in the first embodiment can also be attained in the second embodiment.

Further, in the second embodiment, since the line GBL of each column corresponds to the lines SBL of two columns, the pitch between the lines GBL can be relaxed in comparison with the first embodiment. Since the pitch between the lines GBL can be thus relaxed, the forming process of the third metal layer, for example, the lithography process and etching process can be performed with a sufficiently large process margin.

Further, in the second embodiment, for example, the data read out is performed for every other line SBL in the read operation. In the read operation, the lines SBL which are adjacent to the line SBL used for data reading are set at 0V, for example. In this state, data read out from the line SBL is not influenced by the potentials from the adjacent lines SBL and the precision of data readout from the line SBL can be enhanced in comparison with the first embodiment.

Further, in the programming operation, for example, the programming operation is performed for every other line SBL. In the programming operation, the lines SBL which are adjacent to the line SBL used for data programming are set to a potential which sets a non-selected state for programming, for example, a potential (VCC−Vth) or potential VCC and more. In this state, data can be programmed into the device according to the second embodiment. No data is programmed into the adjacent lines SBL, a potential does not basically change except due to the coupling noise. Therefore, the potential (VCC−Vth) corresponding to "1" data and the potential 0V corresponding to "0" data transferred to the line SBL are not influenced and the precision of transfer of programming data to the line SBL can be enhanced in comparison with the first embodiment.

Next, a nonvolatile semiconductor memory device according to a modification of the second embodiment is explained.

Figure 18:
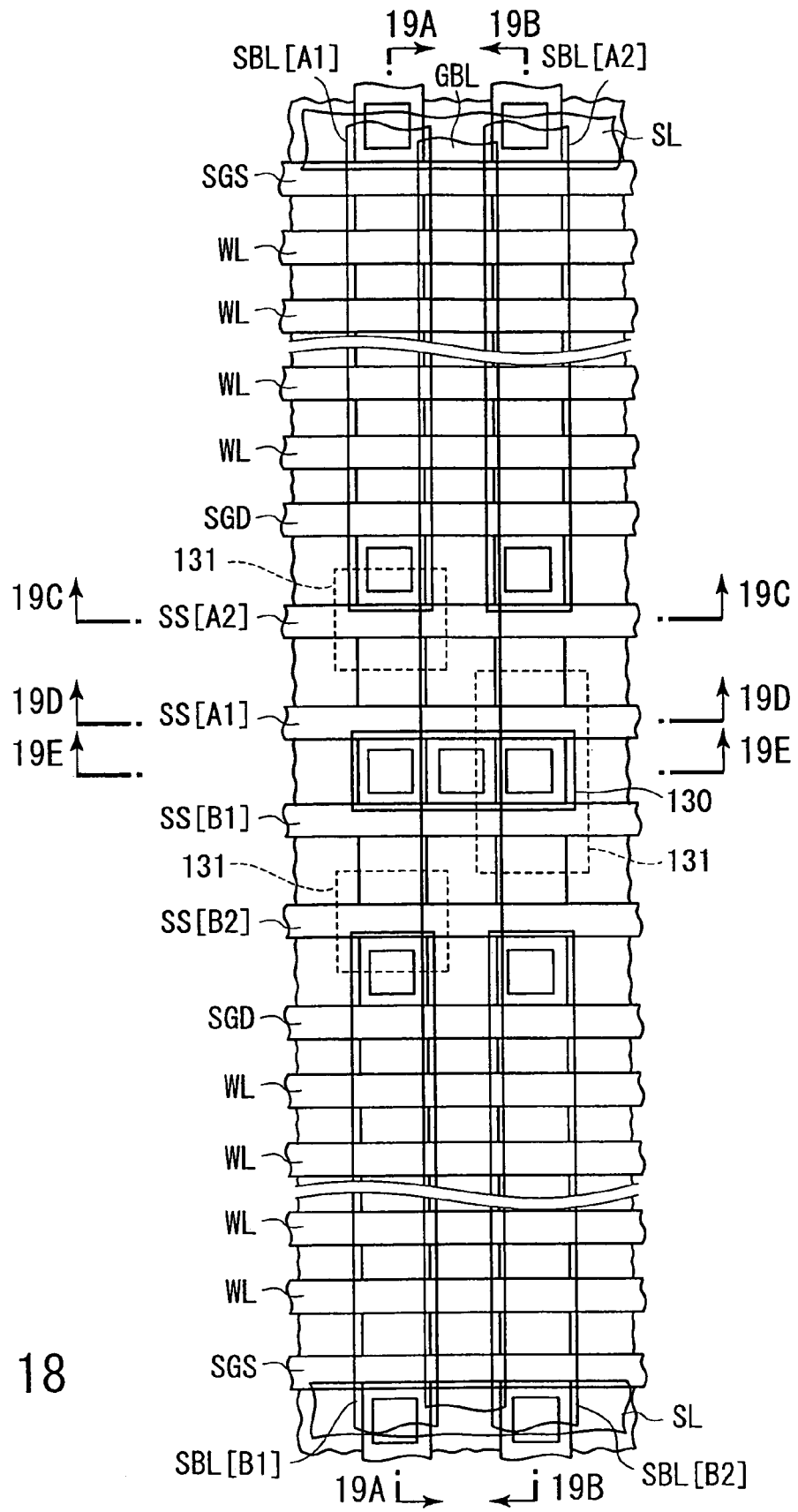
FIG. 18 is a plan view showing an example of the plane pattern of a memory cell array of the nonvolatile semiconductor memory device according to a modification of the second embodiment.
Figure 19C:
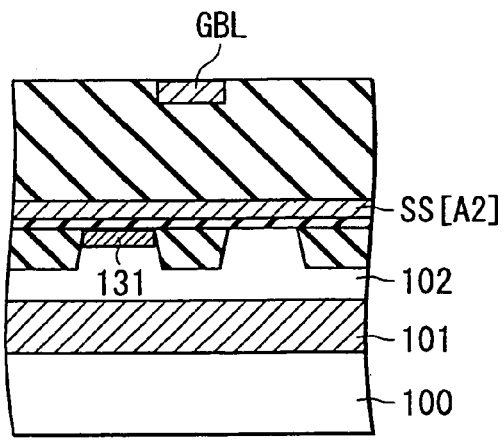
FIG. 19C is a cross sectional view taken along the 19C-19C line of FIG. 18.
Figure 19D:
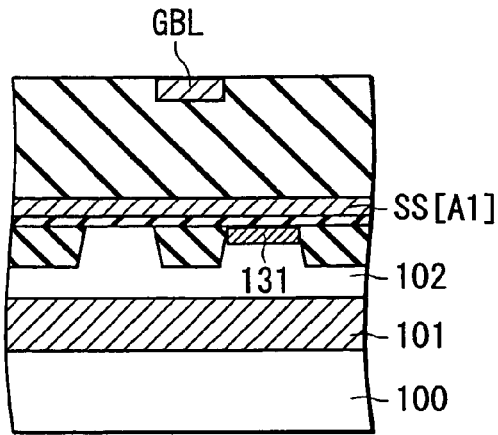
FIG. 19D is a cross sectional view taken along the 19D-19D line of FIG. 18.
Figure 19E:
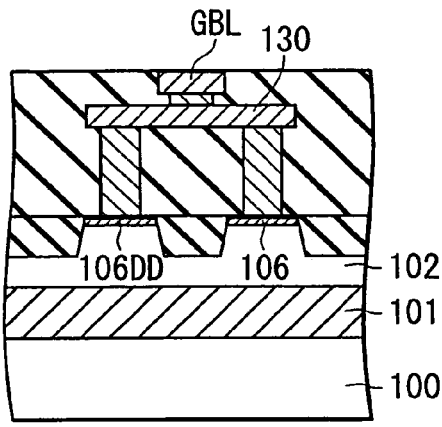
FIG. 19E is a cross sectional view taken along the 19E-19E line of FIG. 18.

FIG. 18 is a plan view showing an example of the plane pattern of a memory cell array of the device according to a modification of the second embodiment FIG. 19A is a cross sectional view taken along the 19A-19A line of FIG. 18, FIG. 19B is a cross sectional view taken along the 19B-19B line of FIG. 18, FIG. 19C is a cross sectional view taken along the 19C-19C line of FIG. 18, FIG. 19D is a cross sectional view taken along the 19D-19D line of FIG. 18, and FIG. 19E is a cross sectional view taken along the 19E-19E line of FIG. 18. The modification is associated with another example of the configuration of the transistors PSST[A2], PSST[B2], PSST[B1], PSST[B2].

As shown in FIGS. 18 and 19A to 19E, in the device according to the modification, the transistors PSST[A1], PSST[B1], PSST[A2], PSST[B2] are depletion type transistors. For example, when the transistors PSST[A1], PSST[B1], PSST[A2], PSST[B2] are of an N-channel type, they are set in the conductive state even if the potentials of the section selection lines SS[A1], SS[A2], SS[B1], SS[B2] are set at 0V, for example.

In this modification, as one example of formation of depletion type transistors, an impurity of the same conductivity type as the source/drain diffusion layer, for example, arsenic which is an N-type impurity is doped into the channel regions below the gate electrodes of the transistors PSST[A1], PSST[B1], PSST[A2], PSST[B2]. The source/drain diffusion layers of the transistors PSST[A1], PSST[B1], PSST[A2], PSST[B2] are short-circuited by use of diffusion layers 131.

Thus, the transistors PSST[A1], PSST[B1], PSST[A2], PSST[B2] can be formed so as not to function as section selection transistors.

The advantage of the modification is that it is not necessary to form contacts between the section selection lines SS[A1] and SS[A2] and between the section selection lines SS[B1] and SS[B2].

Figure 20:
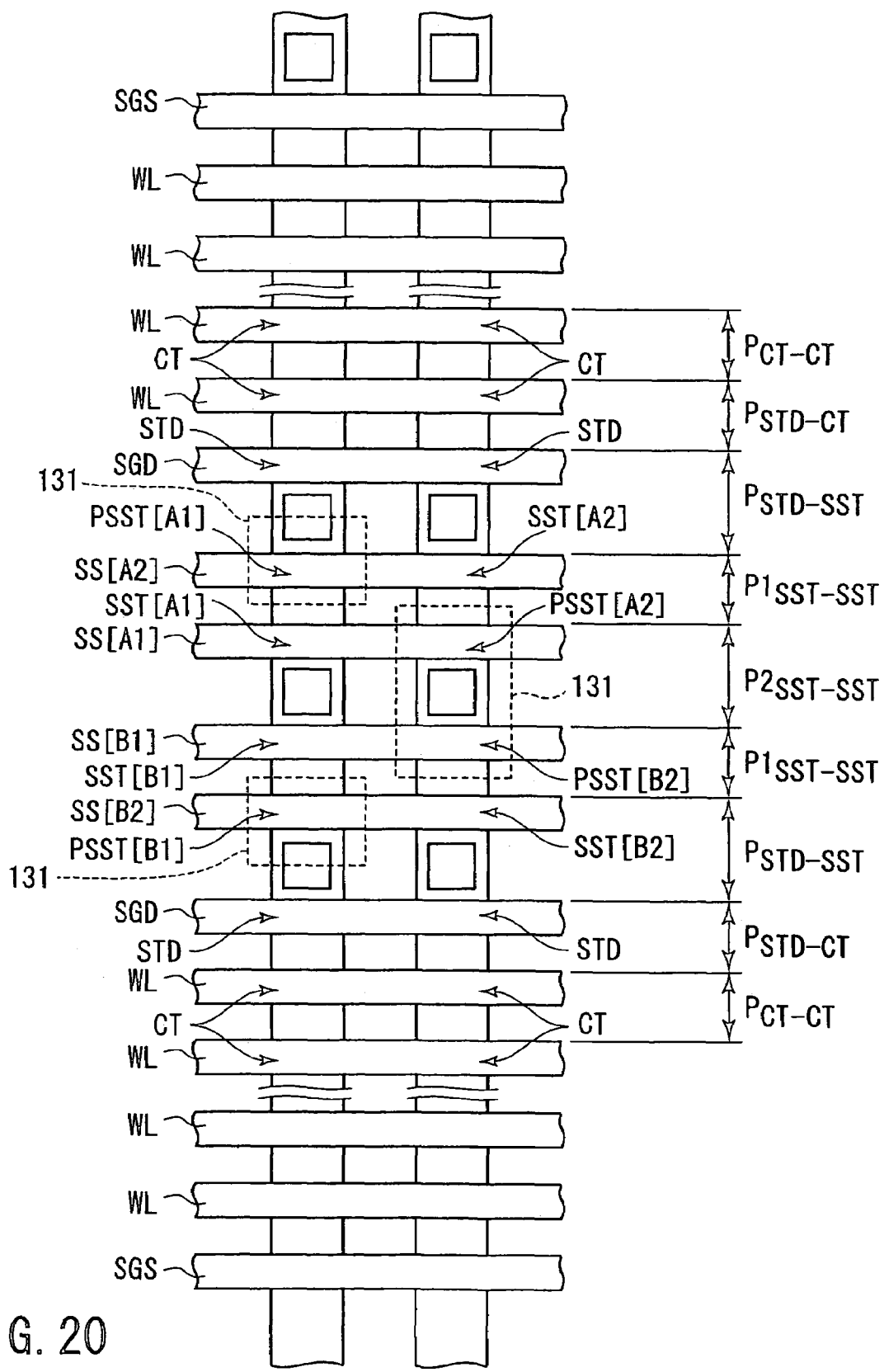
FIG. 20 is a plan view showing an example of the advantage attained by the nonvolatile semiconductor memory device according to a modification of the second embodiment.

Therefore, for example, as shown in FIG. 20, the distances between the section selection lines SS[A1] and SS[A2] and between the section selection lines SS[B1] and SS[B2] (which are expressed as the distances $P1_{SST-SST}$) can be reduced and the integration density of the memory cell array can be enhanced.

THIRD EMBODIMENT

Recently, a nonvolatile semiconductor memory device is not only used as a file memory, but also used to store programming data in a portion thereof. For example, the device is so used that a communication program of a cellular phone will be stored into an address space of several ten Mbytes in the nonvolatile semiconductor memory device.

For example, when the communication program is stored into the nonvolatile semiconductor memory device, tasks related to the communication asynchronously occur during the programming operation of the file memory. It is necessary to perform the operation for reading out the communication program to the exterior in preference to the programming operation. In order to serve the above purpose, conventionally, a configuration is made such that a volatile memory such as a DRAM of high access speed is prepared and programming data stored in the nonvolatile semiconductor memory device is transferred to the volatile memory at the power supply turn-ON time. However, since the volatile memory having a memory capacity of tens of Mbytes is prepared in the external portion, there occurs a problem that the cost of the system becomes high.

Therefore, an example in which the read operation is performed during the programming operation is explained as the third embodiment of this invention.

Figure 21:
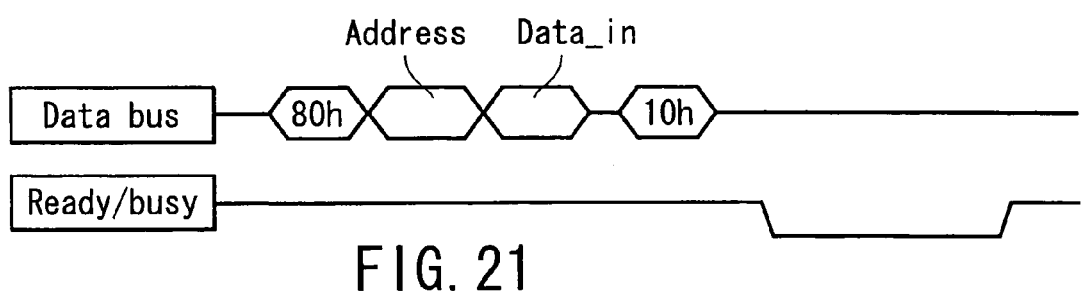
FIG. 21 is an operation waveform diagram showing the operation of an external data bus at the programming operation time of a typical system.

FIG. 21 is an operation waveform diagram showing the operation of an external data bus in the programming operation of a typical system.

In a typical nonvolatile semiconductor memory device, an address is divided and input via an I/O unit in several steps after a programming command 80H is input. Then, successive programming data items of 512 bytes are input to a data latch. After this, the internal sequencer starts the programming operation when a command 10H is input and the device is transited from a ready state to a busy state. As described above, the programming operation is performed by repeatedly performing the programming operation and verify read operation.

Figure 22:
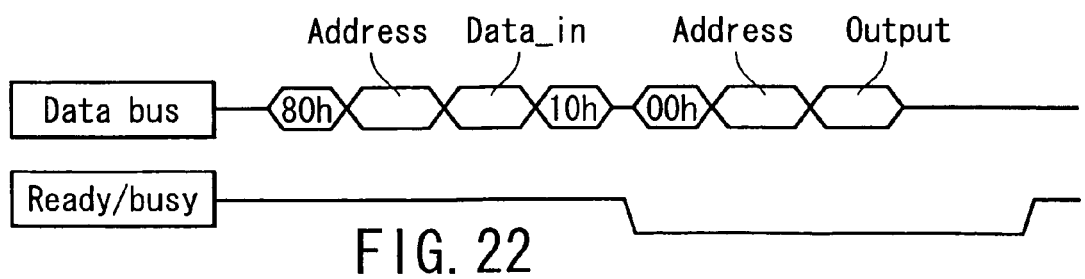
FIG. 22 is an operation waveform diagram showing the operation of an external data bus at the programming operation time of a nonvolatile semiconductor memory device according to a third embodiment of this invention.

FIG. 22 is an operation waveform diagram showing an operation of an external data bus in the programming operation of a nonvolatile semiconductor memory device according to the third embodiment of this invention.

As shown in FIG. 22, in the third embodiment, even when the nonvolatile semiconductor memory device is set, in the busy state during the programming operation and if a read command 00H is input from the exterior, memory cell data of a page designated by an address following the read command 00H is instantly read out.

Figure 23:
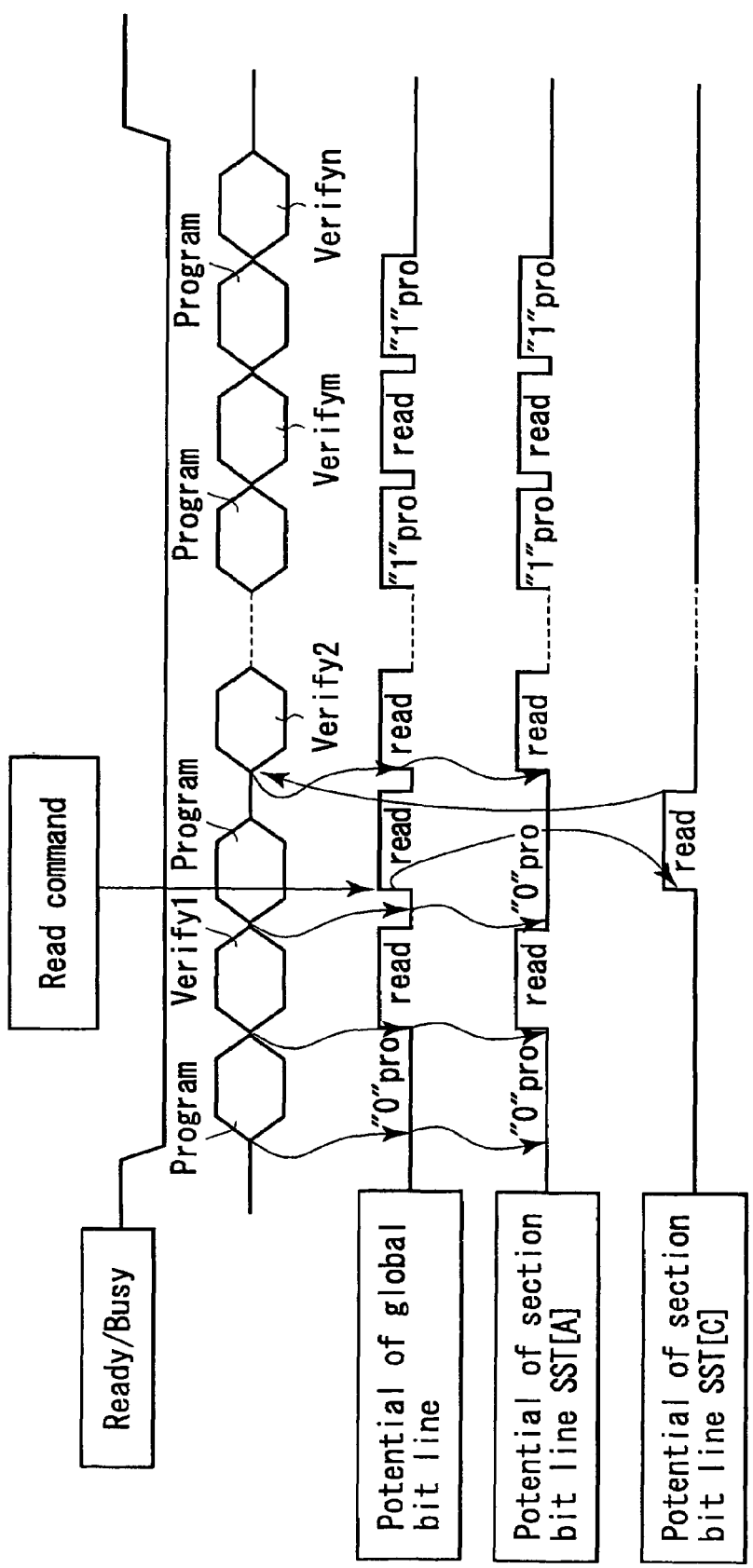
FIG. 23 is an operation waveform diagram showing the internal operation sequence in a case wherein an interruption of the readout operation is made during the programming operation of the nonvolatile semiconductor memory device according to the third embodiment of this invention.

FIG. 23 shows the internal operation sequence in a case wherein an interruption of the readout operation is made during the programming operation of the nonvolatile semiconductor memory device according to the third embodiment.

For example, the programming operation (Program) and the verify read operation (Verify) are repeatedly performed as described before when the programming operation of data into a page selected in the section [A] is started. As shown in FIG. 23, it is assumed that a read command 00H is input during the second programming operation (Program) and a read-request is made with respect to a page in the section [C]. In this case, the section selection transistor SST[C] which is used to select the line SBL[C] in the section [C] is set into the conductive state to connect the line GBL to the line SBL[C]. Then, the lines SBL[A], SBL[B], SBL[D], ... are set into the electrically floating state in a preset period of read time. In this state, data is read out from the selected page of the section [C] to the data latch circuit DL via the lines SBL[C], GBL and the logic value of readout data is determined based on whether the potential of the line GBL is lowered to preset potential or not. During the read operation, programming data is stored in the line SBL[A] in the section [A]. Since the transistor SST[A] is set in the nonconductive state, data can be correctly programmed into the selected memory cell in the section [A] without destroying programming data stored in the line SBL[A] even if data is read out from the section [C].

After completion of the read operation with respect to the section [C], the verify read operation of the page which is under the programming operation of the section [A] is started again.

Figure 24:
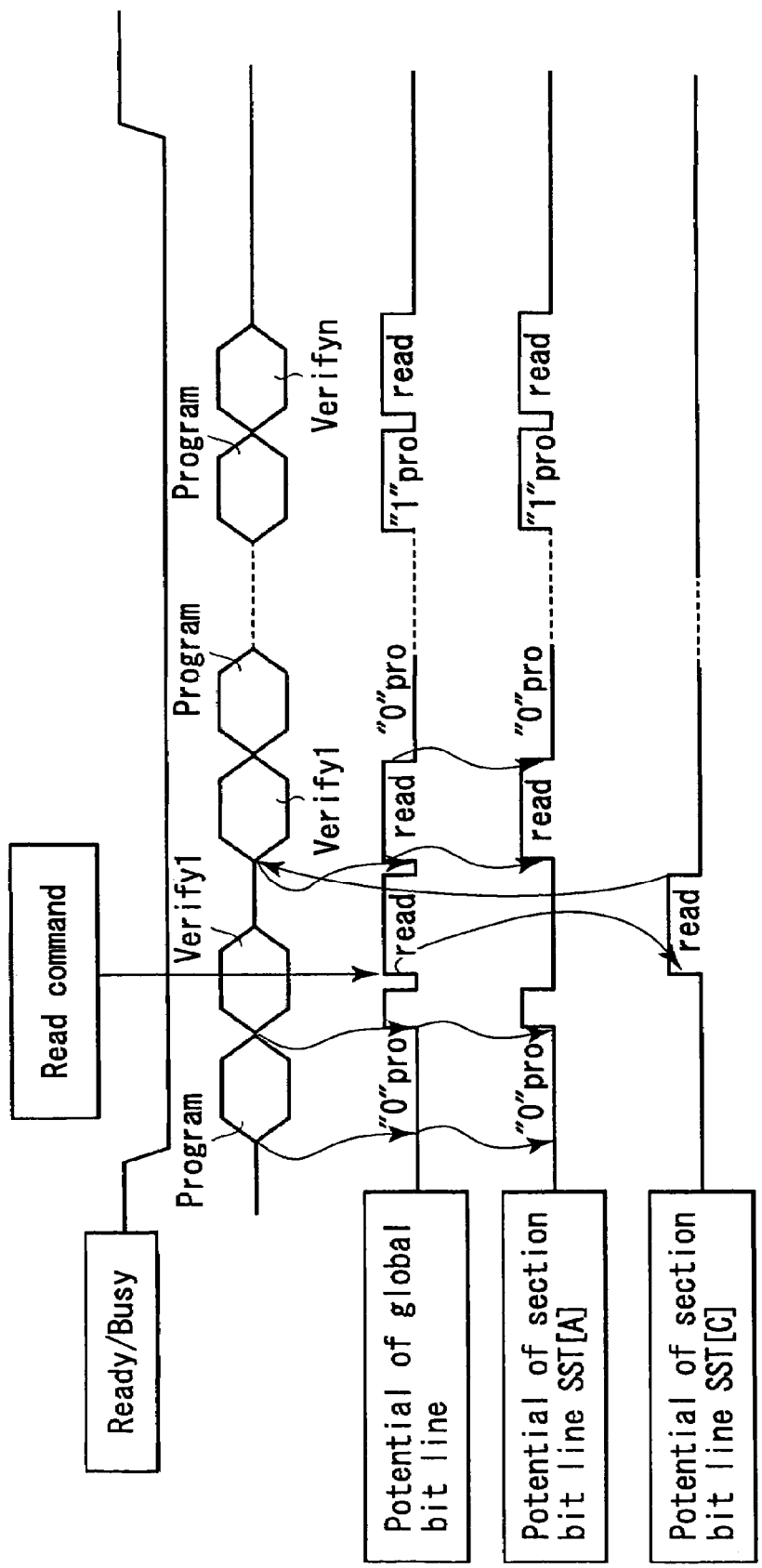
FIG. 24 is an operation waveform diagram showing the internal operation sequence in a case wherein an interruption of the readout operation is made during the verify read operation of the nonvolatile semiconductor memory device according to the third embodiment of this invention.

FIG. 24 shows the internal operation sequence in a case wherein an interruption of the read operation is made during the verify read operation of the nonvolatile semiconductor memory device according to the third embodiment.

As shown in FIG. 24, it is assumed that a read command 00H is input during the verify read operation (Verify1) and a read request is made with respect to a page in the section [C]. In this case, the verify read operation (Verify1) is set into a suspend state when the read command 00H is input. For example, the sequencer interrupts the verify read operation (Verify1) and releases the line GBL from the verify read operation (Verify1). Then, data is read out from the selected page of the selected section [C] to the data latch circuit DL via the lines SBL[C], GBL.

After completion of the read operation with respect to the section [C], the sequencer restarts the verify read operation (Verify1) with respect to the memory cell in the section [A] which has been subjected to the programming operation. In this example, a case wherein the read command 00H is input from the exterior during the first verify read operation is explained, and the first verify operation is restarted when the verify read operation is restarted.

With the nonvolatile semiconductor memory device according to the third embodiment, the read operation can be instantly started during the programming operation. Therefore, for example, the capacity of a cache memory in the system can be made small and the cost of the system can be suppressed.

FOURTH EMBODIMENT

The fourth embodiment relates to an example in which the read operation speed is enhanced. In the fourth embodiment, for example, the read operation is simultaneously performed for a plurality of sections in the same memory cell array to enhance the read operation speed.

Figure 25:
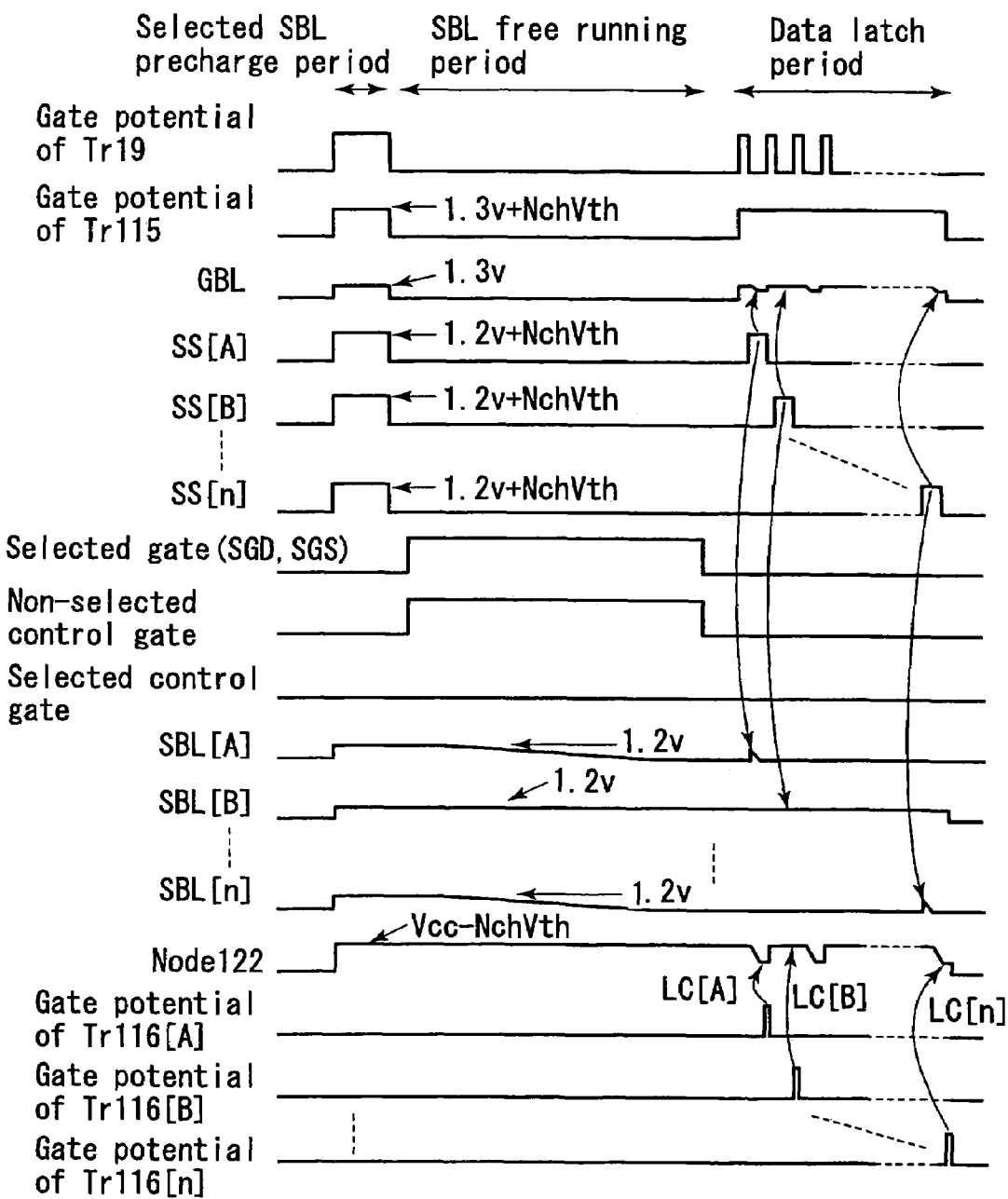
FIG. 25 is an operation waveform diagram showing an example of the operation of a nonvolatile semiconductor memory device according to a fourth embodiment of this invention.

FIG. 25 is an operation waveform diagram showing an example of the operation of a nonvolatile semiconductor memory device according to the fourth embodiment.

First, in the initial period of the read operation, the potential of plurality of section selection lines SS of the sections to be read is set to a voltage higher than 1.2V by a threshold voltage of a section selection transistor SST. Thus, a plurality of transistors SST are simultaneously set into the selected state. Further, referring to FIG. 7, the gate electrode of the transistor 119 is set to the potential VCC and the gate electrode of the transistor 115 is set to a voltage higher than 1.3V by a threshold voltage of a transistor 115. As a result, the line GBL is precharged to 1.3V and the bit lines SBL selected by the transistors SST are precharged to 1.2V. At this time, the potential of the node 122 of the data latch circuit DL is precharged to a voltage lower than the potential VCC by a threshold voltage of the transistor 119 (selected SBL precharge period).

At the end of the selected SBL precharge period, the potential of the section selection line SS is grounded to VSS and the transistor SST is set into the nonconductive state. Following the SBL precharge period, two block selection lines SGS, SGD in selected blocks in plurality of sections are set to the potential VCC, and at the same time, the non-selected control gate in the selected block is raised to a preset potential of approximately 4V.

At this time, the potential of the selected control gate is held at VSS. As a result, the bit line SBL is discharged and the potential thereof is lowered from 1.2V when the selected cell transistor stores "1" data. Further, when the selected cell transistor stores "0" data, the bit line SBL is not discharged and the potential thereof is held at 1.2V (SBL free running period).

After the end of the SBL free running period, the operation for latching readout data items corresponding to the potentials of the bit lines SBL into the data latch LC is performed.

In the data latch period of FIG. 25, the operation for sequentially latching readout data items into the data latch LC shown in FIG. 7 is performed.

First, the gate electrode of the transistor 119 is set to the potential VCC to precharge the node 122 and line GBL and then the section selection line SS[A] is set to a voltage higher than 1.2V by a threshold voltage of the transistor SST[A]. As a result, the transistor SST[A] is set into the conductive state to lower the potential of the line GBL if the potential of the bit line SBL[A] is lower than 1.2V. In order to enhance the response speed of the line GBL, it is preferable to reduce the parasitic capacitance of the line GBL. For this purpose, for example, the width of the line GBL in the row direction is made as small as possible so as to make the parasitic capacitance of the line GBL small.

In FIG. 25, a case wherein the line SBL[A] is discharged is described. In this case, since the potential of the line GBL is lowered and the transistor 115 in the data latch circuit LC is set into the conductive state, the potential of the node 122 in the data latch circuit LC is also lowered to the same potential as that of the line GBL. Then, information indicating that the node 122 is set in the "LOW" level state is latched into the data latch LC[A] by setting the transistor 116[A] into the conductive state at the timing shown in FIG. 25. As a result, data in the selected cell transistor of the section [A] is stored into the data latch LC[A].

After this, the gate electrode of the transistor 119 is set to the potential VCC again to precharge the node 122 and line GBL. Then, the potential of the section selection line SS[B] is set to become equal to the potential of the line SS[A]. Since the transistor SST[B] is set in the nonconductive state if the line SBL[B] of the section [B] is held at 1.2V, the potential of the line GBL is held at 1.3V. Further, the transistor 115 of the data latch circuit DL is set into the nonconductive state and the node 122 maintains the "HIGH" level. Then, information indicating that the node 122 is set in the "HIGH" level state is latched into the data latch LC[B] by setting the transistor 116[B] into the conductive state at the timing shown in FIG. 25. As a result, data of the selected cell transistor of the section [B] is stored into the data latch LC[B].

Likewise, data items corresponding to the potentials of the lines SBL of the plurality of sections are stored into the plurality of data latches LC in the data latch circuit DL.

In the fourth embodiment, a method for simultaneously reading out a plurality of pages of the plurality of sections is explained and the same method can be applied to the verify read operation.

For example, in the verify read operation in the programming operation, the operation in the selected SBL precharge period and SBL free running period is the same as the above read operation. In this case, instead of directly latching data into the data latch LC during the data latch period, data is temporarily latched in the sense circuit SLC and the result of latching is fed back to the data latch LC via the node 125.

Further, since the cell transistors are connected in series if the nonvolatile semiconductor memory device is of a NAND type, a cell current which is as small as approximately 1 μA flows and a period of approximately 10 μsec is required for the SBL free running period. For this reason, if eight pages are successively read, a period of approximately 80 μsec is required for the free running period.

On the other hand, in the fourth embodiment, since the free running period can be set to approximately 10 μsec, the read performance for each page can be enhanced.

FIFTH EMBODIMENT

Next, a card system using the nonvolatile semiconductor memory device according to the above embodiment is explained as a fifth embodiment of this invention.

Figure 26:
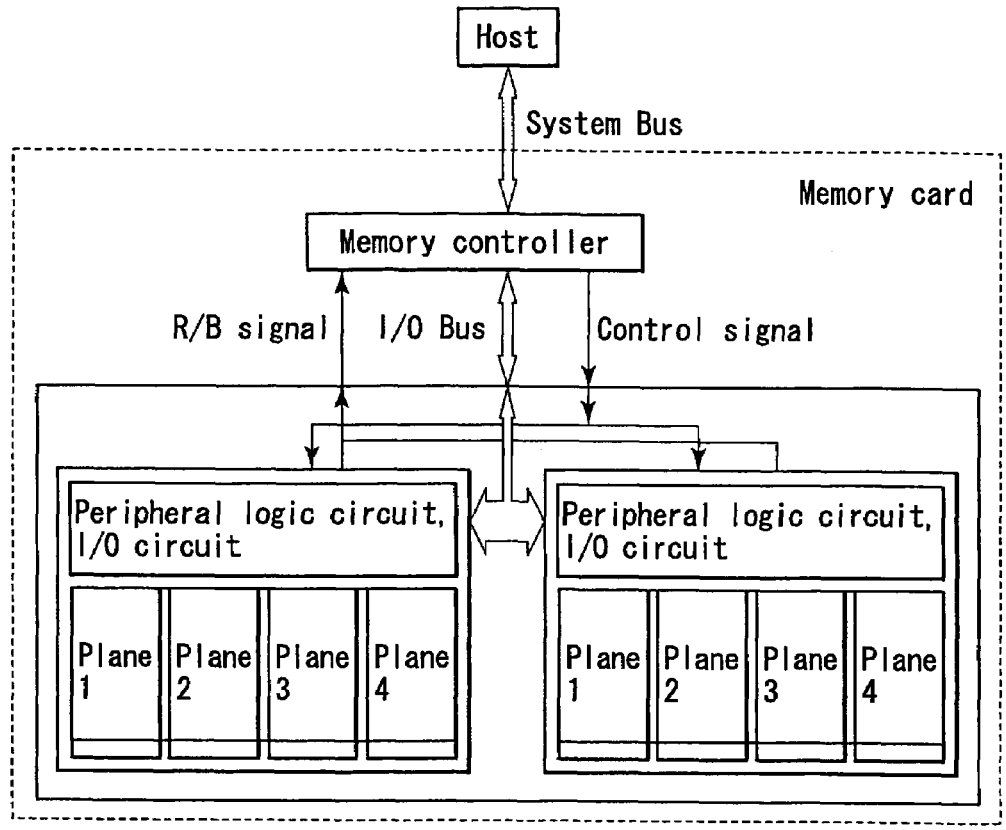
FIG. 26 is a block diagram showing an example of the configuration of a memory card.
Figure 27:
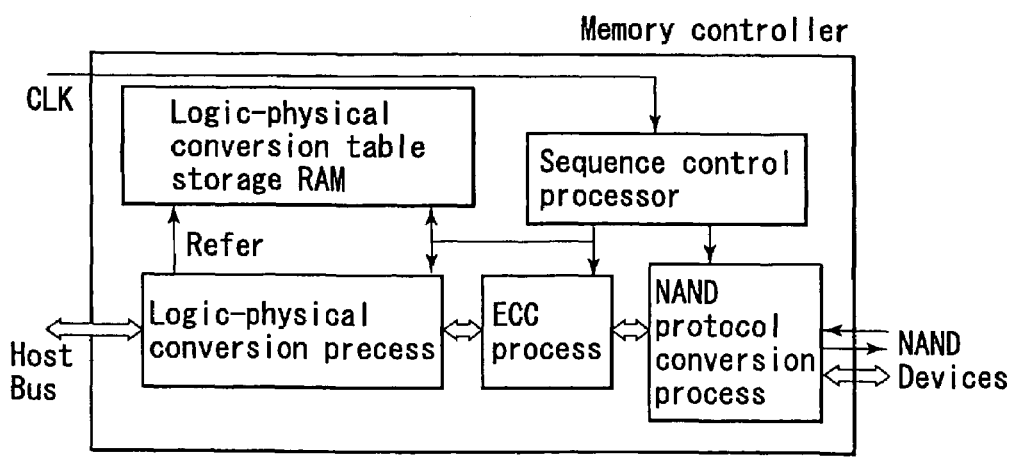
FIG. 27 is a block diagram showing an example of the configuration of a memory controller.
Figure 28:
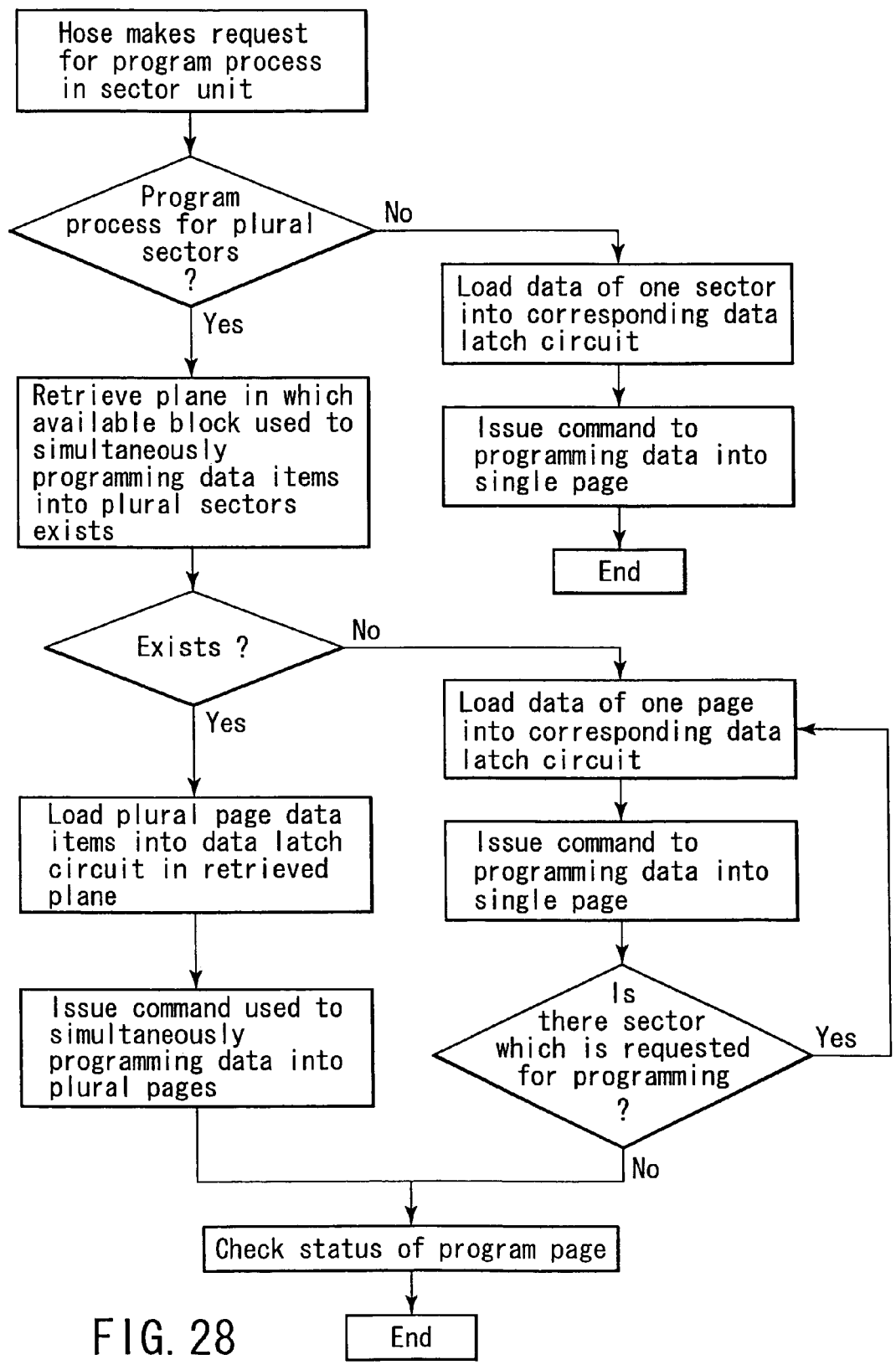
FIG. 28 is a flow diagram showing an example of the control process of the system.

FIG. 26 is a block diagram showing an example of the configuration of a memory card, FIG. 27 is a block diagram showing an example of the configuration of a memory controller, and FIG. 28 is a flow diagram showing an example of the control process of the system. In the fifth embodiment, a case wherein the memory card is connected to the bus of a host system is explained.

As shown in FIG. 26, the memory card includes a memory controller chip and two NAND nonvolatile semiconductor memory devices, for example. Of course, the memory card can include one, three or more NAND nonvolatile semiconductor memory devices.

An internal bus between the memory controller and the memory chip includes an I/O bus, control signal lines of CE, ALE, CLC, RE, WE, WP and R/B signal line. The memory controller transfers an address, a command, a programming data and a readout data with respect to the memory chip via the I/O bus. In the internal portion of the memory chip, the memory cell array is divided into four planes and a data latch circuit corresponding to the page length of each plane is arranged on the end portion of each plane via bit lines. In each of the memory chips, a row decoder circuit is arranged in contact with the memory cell array, and address latch circuits of a number corresponding to the number of sections are arranged in the peripheral circuit of each chip. Further, a latch circuit is arranged in the row decoder circuit to receive an output signal of the address latch circuit and make a multiple selection for desired blocks in the respective sections. The circuit technology for simultaneously selecting a plurality of blocks by use of the latches provided in the row decoder is a known technology used as the plural block erase technology thus a detailed explanation thereof is omitted.

The address spaces of the two chips of FIG. 26 are connected in series and memory addresses of the second chip are allocated to the upper positions of the first chip. Each of the chips has an extra address latch circuit corresponding to several chips of address and decodes address input from the exterior. Only one of the chips in which the decoded address coincides with its address space area is activated.

As shown in FIG. 27, the memory controller includes a processing circuit (logical-physical conversion process) which makes a conversion between a logical address (host address) and a physical address (nonvolatile semiconductor memory device management address) and a RAM circuit which stores a logical-physical conversion table required to perform the logical-physical conversion process. It further includes an ECC processing circuit which subjects data of page units to the ECC process, a nonvolatile semiconductor memory device protocol conversion processing circuit (NAND protocol conversion circuit) which executes programming, erase and read instructions with respect to the nonvolatile semiconductor memory device, and a sequence control processor which controls the above circuits.

When the memory controller receives a programming instruction from the host, it performs the programming process with respect to the nonvolatile semiconductor memory device chip according to the sequence shown in FIG. 28. First, it determines whether the programming instruction from the host corresponds to plural pages or not. If the programming instruction corresponds to plural pages, it retrieves a plane address in which a programmable block used to simultaneously programming data items into a plurality of sectors lies over a plurality of sections. If the plane address is detected, the memory controller allocates block addresses in the plurality of sections of the plane and page addresses in the block to a plurality of sector addresses of the host. The thus allocated plural page data items are loaded into a plurality of page buffers of the plane. Then, a command used to perform the programming operation according to the sequence shown in FIG. 8 or 16 is issued.

When the programming instruction from the host corresponds to one page, an available block is retrieved by a general method, a page address in the detected block is allocated to the sector address of the host and data of one page is loaded into an address corresponding to the plane address of the available block. After this, a conventional programming command is issued to program data of one page.

When data items are programmed into a plurality of sectors and if a programmable block used to simultaneously programming data items into the plurality of sectors does not lie over a plurality of sections, it is necessary to allocate the respective sectors to an available block of another plane in the chip. Therefore, the programming process for each page as in the conventional case is performed with respect to the whole program request sectors.

When the above programming process is completed, the status of each page in which data has been programmed is reviewed and the programming process is terminated if no abnormal state is detected. If an abnormal state is detected, a page address in which the abnormal state is detected is reallocated to a different address and the programming process is performed again.

Thus, in the memory card of the fifth embodiment, the programming performance in the case of data programming into a plurality of pages can be enhanced by determining whether or not the programming process with respect to the plurality of pages from the host is performed and performing a different programming process with respect to the nonvolatile semiconductor memory device chip.

SIXTH EMBODIMENT

In a sixth embodiment, examples of an IC card using the nonvolatile semiconductor memory device according to the above embodiment and an electronic device using the IC card are explained.

Figure 29:
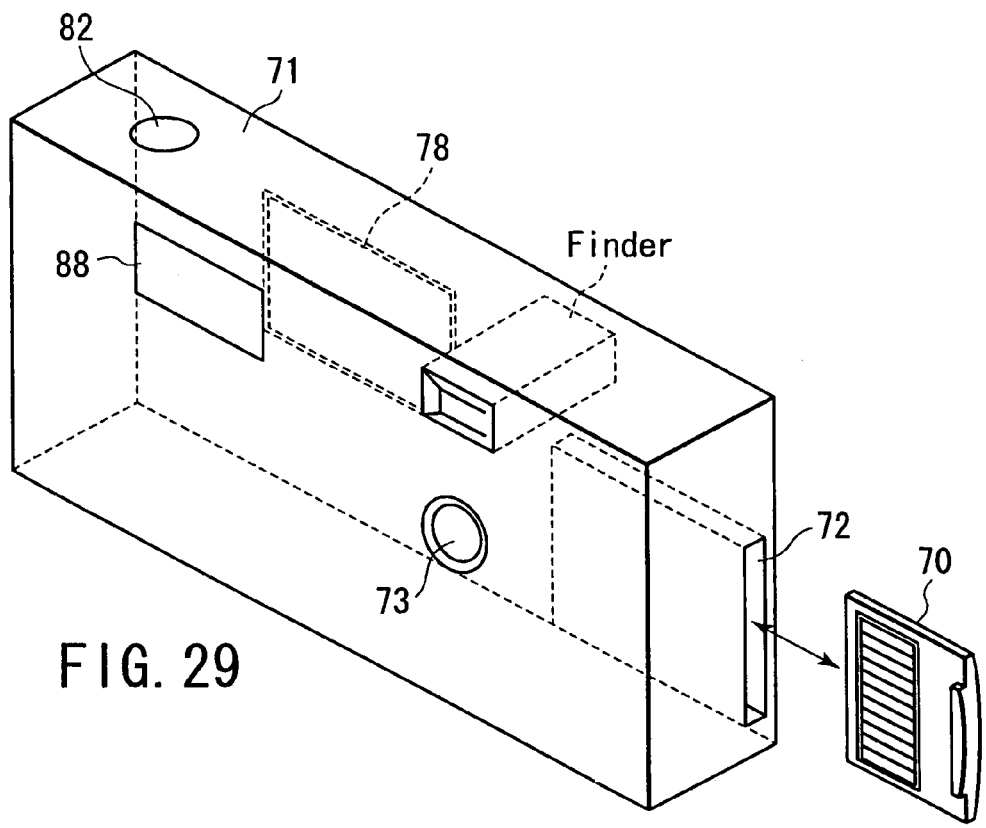
FIG. 29 is a perspective view showing an example of an electronic device which utilizes an IC card according to a sixth embodiment of this invention.
Figure 31A:
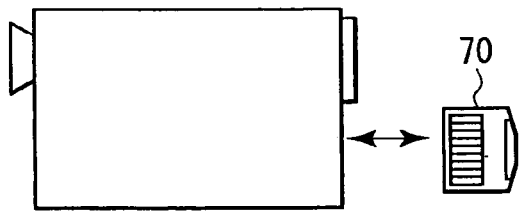
FIGS. 31A to 31L are diagrams showing other examples of an electronic device which utilizes the IC card according to the sixth embodiment of this invention.
Figure 31B:
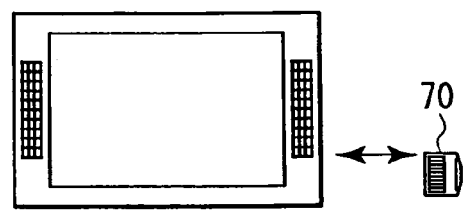
Figure 31C:
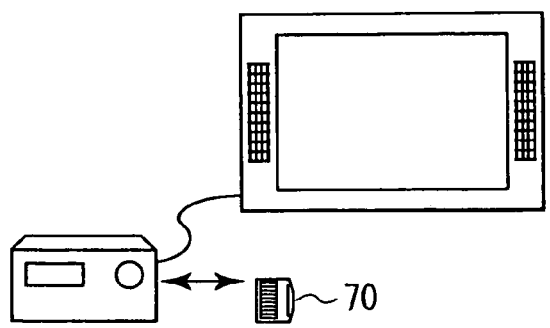
Figure 31D:
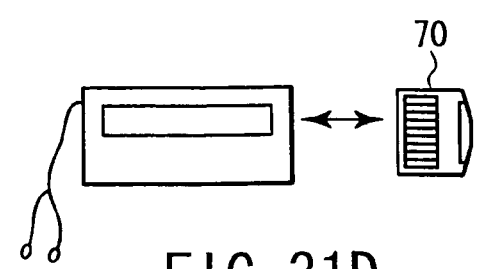

FIG. 29 is a perspective view showing an example of an electronic device which utilizes the IC card according to the sixth embodiment of this invention. In FIG. 29, as an example of the electronic device, a mobile electronic device, for example, digital still camera is shown. The IC card according to the sixth embodiment is a memory card, for example, and used as a recording medium of the digital still camera, for example.

As shown in FIG. 29, a card slot 72 and a circuit board connected to the card slot 72 are formed in a case of a digital still camera 71. The circuit board is not shown in FIG. 29. A memory card 70 can be detachably inserted into the card slot 72 of the digital still camera 71. When inserted into the card slot 72, the memory card 70 is electrically connected to the electronic circuit on the circuit board.

Figure 30:
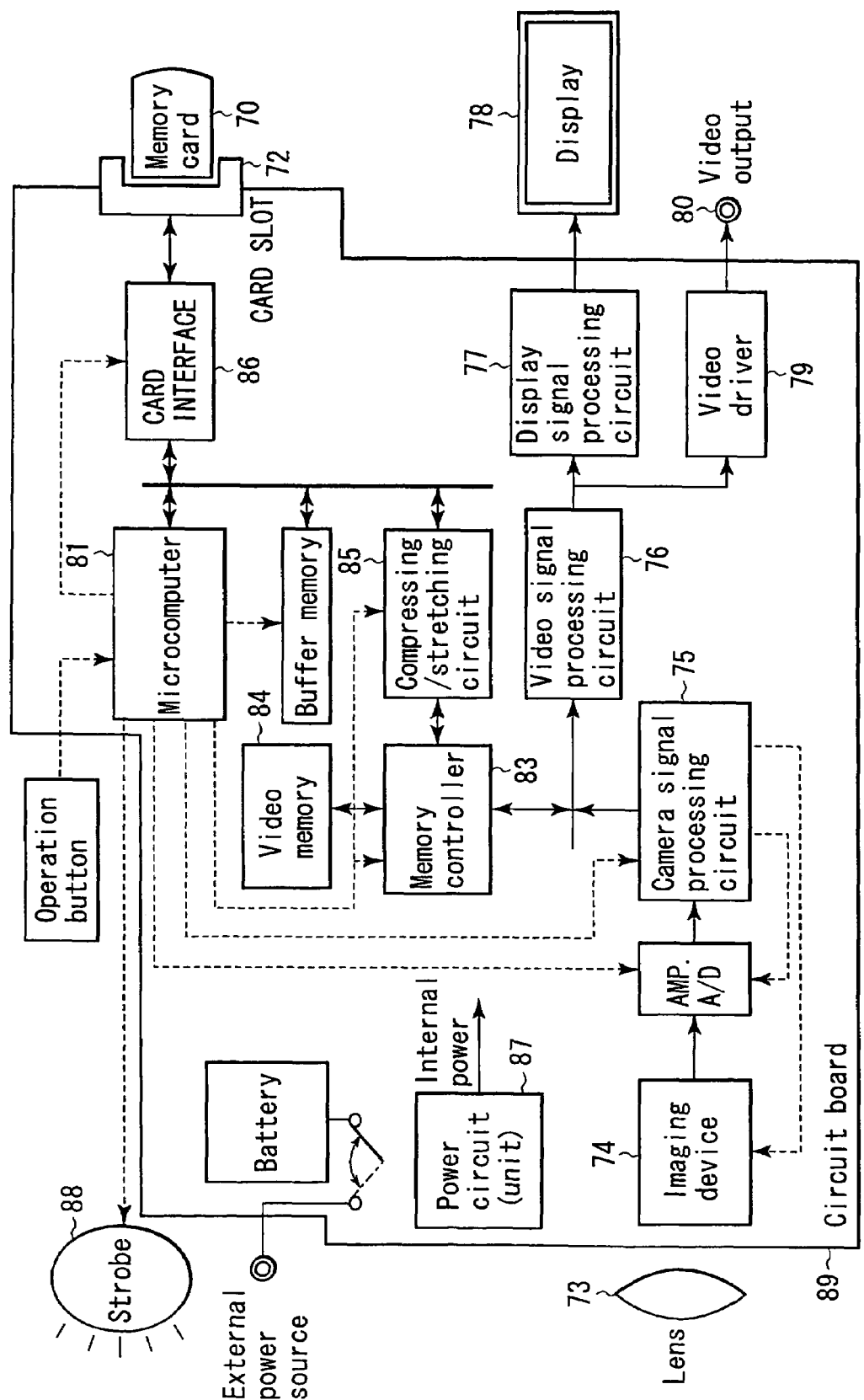
FIG. 30 is a block diagram showing a basic system of a digital still camera.
Figure 31E:
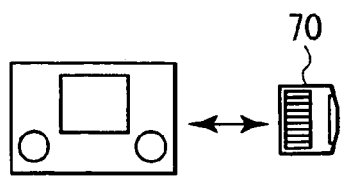
Figure 31F:
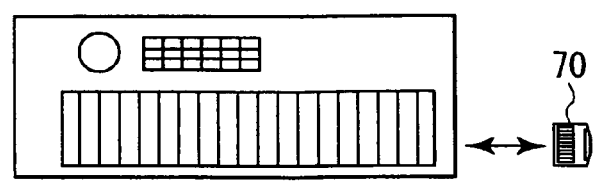
Figure 31G:
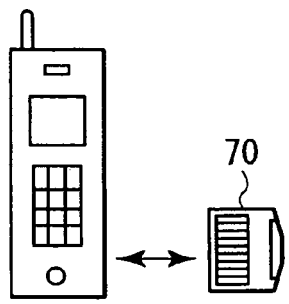
Figure 31H:
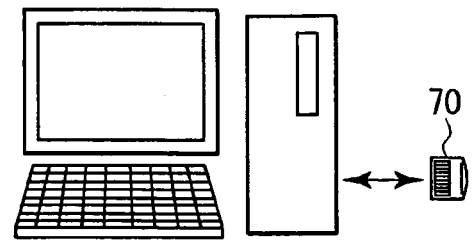
Figure 31I:
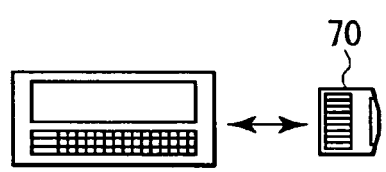
Figure 31J:
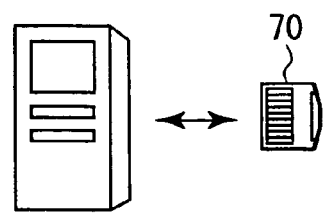
Figure 31K:
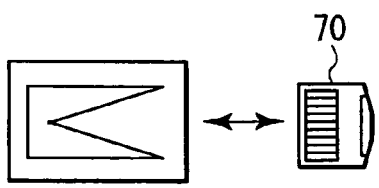
Figure 31L:
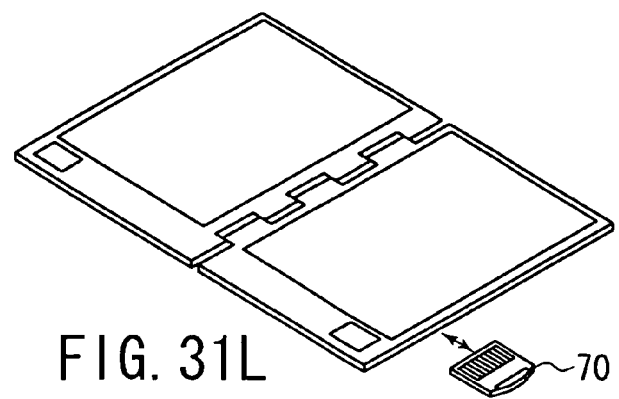

FIG. 30 is a block diagram showing a basic system of the digital still camera.

Light from a subject is focused on an imaging device 74 by a lens 73. The imaging device 74 photo-electrically converts the input light into an analog signal, for example. One example of the imaging device 74 is a CMOS image sensor. The analog signal is amplified by an analog amplifier (AMP.) and then is converted into a digital signal by an A/D converter (A/D). The signal converted into a digital form is input to a camera signal processing circuit 75, subjected to an auto exposure control process (AE), an auto white balance control process (AWB) and a color separation process and then is converted into a luminance signal and color-difference signal.

When an image is monitored, a signal output from the camera signal processing circuit 75 is input to a video signal processing circuit 76 and is converted into a video signal. As a system of the video signal, for example, NTSC (National Television System Committee) can be given. The video signal is output to a display unit 78 mounted on the digital still camera 71 via a display signal processing circuit 77. One example of the display unit 78 is a liquid crystal monitor. Further, the video signal is output to a video output terminal 80 via a video driver 79. An image taken by the digital still camera 71 can be output to a display device such as a television or a display of a personal computer via the video signal output terminal 80. Thus, it is possible to enjoy watching the image on a screen other than the display unit 78. The imaging device 74, the analog amplifier (AMP.), the A/D converter (A/D) and the camera signal processing circuit 75 are controlled by a microcomputer 81.

When an image is being captured, an operation button, for example, a shutter button 82 is depressed. As a result, the microcomputer 81 controls the memory controller 83 to program a signal output from the camera signal processing circuit 75 into a video memory 84 as a frame image. The frame image programmed into the video memory 84 is compressed based on a preset compression format by use of a compression/expansion processing circuit 85 and recorded on the memory card 70 inserted into the card slot 72 via a card interface 86.

When the recorded image is being replayed, the image recorded on the memory card 70 is read out via the card interface 86, is expanded by the compression/expansion processing circuit 85 and then is programmed into the video memory 84. The thus programmed image is input to the video signal processing circuit 76 and displayed on the display unit 78 or another display device like the case wherein the image is monitored.

In the example of the present basic system, a case wherein a card slot 72, imaging device 74, analog amplifier (AMP.), A/D converter (A/D), camera signal processing circuit 75, video signal processing circuit 76, display unit 77, video driver 79, microcomputer 81, memory controller 83, video memory 84, compression/expansion processing circuit 85 and card interface 86 are mounted on a circuit board 89 is shown. It is not always necessary to mount the card slot 72 on the circuit board 89 and it is possible to connect the card slot to the circuit board 89 via a cable or the like. Further, in this example, a power supply circuit 87 is mounted on the circuit board 89. The power supply circuit 87 receives power supply voltage from a battery cell or external power supply and supplies internal power supply voltage used in the internal portion of the digital still camera 71. One example of the power supply circuit 87 is a DC-DC converter. The internal power supply voltage is supplied as power supply voltage for a strobe 88 and power supply voltage for the display unit 78 in addition to power supply voltage for the operation of the above circuits.

Thus, the memory card using the nonvolatile semiconductor memory device according to the above embodiment can be used in mobile electronic devices such as a digital still camera.

Further, the memory card using the nonvolatile semiconductor memory device according to the above embodiment is used in the digital still camera. In addition, as shown in FIGS. 31A to 31L, the memory card can be used in a video camera (FIG. 31A), a television (FIG. 31B), an audio/visual device (FIG. 31C), an audio device (FIG. 31D), a game device (FIG. 31E), an electronic musical instrument (FIG. 31F), a portable telephone (FIG. 31G), a personal computer (FIG. 31H), a personal digital assistant (PDA, FIG. 31I), a voice recorder (FIG. 31J), a PC card (FIG. 31K), an electronic book terminal (FIG. 31L) and the like.

Further, the memory card using the nonvolatile semiconductor memory device according to the above embodiment can also be used in other electronic devices.

The first to sixth embodiments of this invention are explained, but the present invention is not limited to the above embodiments and can be modified without departing from the technical scope thereof when embodying this invention.

Further, the above embodiments can be independently carried out, but it is possible to adequately combine and carry out the embodiments.

Inventions of various stages are contained in the above embodiments and inventions at various stages can be extracted by adequately combining a plurality of constituents disclosed in the above embodiments.

In the above embodiments, a case wherein this invention is applied to the nonvolatile semiconductor memory device is explained. However, a semiconductor integrated circuit device such as a processor, system LSI which contains the nonvolatile semiconductor memory device can be contained in the scope of this invention.

As described above, according to the semiconductor integrated circuit device of the embodiments of this invention, the programming operation speed can be enhanced while an increase in the chip area is suppressed. Further, an IC card containing the semiconductor integrated circuit device can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   first transistor units formed on a semiconductor substrate, first one of the first transistor units including a first select transistor, a second select transistor and first cell transistors whose current paths are connected in series between a source region of the first select transistor and a drain region of the second select transistor;
   second transistor units formed on the semiconductor substrate, first one of the second transistor units including a third select transistor, a fourth select transistor and second cell transistors whose current paths are connected in series between a source region of the third select transistor and a drain region of the fourth select transistor;
   a first section select transistor which is formed on the semiconductor substrate and which has a source region electrically connected to a drain region of the first select transistor;
   a second section select transistor which is formed on the semiconductor substrate and which has a source region electrically connected to a drain region of the third select transistor and has a drain region shared with the first section select transistor;
   a first contact plug formed on the drain region of the first and second section select transistors; and
   a first bit line connected to the first contact plug.

2. The device according to claim 1, wherein second one of the first transistor units including a fifth select transistor, a sixth select transistor and third cell transistors whose current paths are connected in series between a source region of the fifth select transistor and a drain region of the sixth select transistor,
   second one of the second transistor units including a seventh select transistor, a eighth select transistor and fourth cell transistors whose current paths are connected in series between a source region of the seventh select transistor and a drain region of the eighth select transistor,
   the device further comprising
   second contact plugs formed on the drain region of the first select transistor and a drain region of the fifth select transistor;
   a second bit line which connects the second contact plugs in common;
   third contact plugs formed on the drain region of the third select transistor and a drain region of the seventh select transistor; and
   a third bit line which connects the third contact plugs in common.

3. The device according to claim 1, further comprising
   third transistor units formed on the semiconductor substrate, one of the third transistor units including a fifth select transistor, a sixth select transistor and third cell transistors whose current paths are connected in series between a source region of the fifth select transistor and a drain region of the sixth select transistor; and
   a third section select transistor which is formed on the semiconductor substrate and which has a source region electrically connected to a drain region of the fifth select transistor and has a drain region electrically connected to the first bit line,
   wherein the fourth select transistor and the sixth select transistor share its source regions.

4. The device according to claim 1, further comprising
   third transistor units formed on the semiconductor substrate, one of the third transistor units including a fifth select transistor, a sixth select transistor and third cell transistors whose current paths are connected in series between a source region of the fifth select transistor and a drain region of the sixth select transistor;
   a third section select transistor which is formed on the semiconductor substrate and which has a source region electrically connected to a drain region of the fifth select transistor and has a drain region electrically connected to the first bit line; and
   an isolation region formed in the semiconductor substrate,
   wherein the drain region of the third select transistor is adjacent to the drain region of the fifth select transistor with the isolation region interposed therebetween.

5. A semiconductor memory device comprising:
   first transistor units formed on a semiconductor substrate, one of the first transistor units including a first select transistor, a second select transistor and first cell transistors whose current paths are connected in series between a source region of the first select transistor and a drain region of the second select transistor;
   second transistor units formed on the semiconductor substrate, one of the second transistor units including a third select transistor, a fourth select transistor and second cell transistors whose current paths are connected in series between a source region of the third select transistor and a drain region of the fourth select transistor;
   a first section select transistor which is formed on the semiconductor substrate and which has a source region connected to a drain region of the first select transistor, the source region being electrically connected to a drain region of the first section select transistor;
   a second section select transistor which is formed on the semiconductor substrate and which has a source region connected to a drain region of the first section select transistor;
   a third section select transistor which is formed on the semiconductor substrate and which has a source region connected to a drain region of the third select transistor, the source region being electrically connected to a drain region of the third section select transistor;
   a fourth section select transistor which is formed on the semiconductor substrate and which has a source region connected to a drain region of the third section select transistor, the fourth section select transistor sharing a drain region with the second section select transistor;
   a first contact plug formed on the drain region of the second and fourth section select transistors; and
   a bit line connected to the first contact plug.

6. The device according to claim 5, further comprising
   a second contact plug formed on the source region of the first section select transistor;
   a third contact plug formed on the drain region of the first section select transistor;
   a first metal wiring layer which connects the second contact plug and the third contact plug;
   a fourth contact plug formed on the source region of the third section select transistor;
   a fifth contact plug formed on the drain region of the third section select transistor; and a second metal wiring layer which connects the fourth contact plug and the fifth contact plug.

7. The device according to claim 5, further comprising a first diffusion layer which is formed in the semiconductor substrate and which connects the drain region and the source region of the first section select transistor; and a second diffusion layer which is formed in the semiconductor substrate and which connects the drain region and the source region of the third section select transistor.

8. The device according to claim 5, further comprising third transistor units formed on a semiconductor substrate, one of the third transistor units including a fifth select transistor, a sixth select transistor and third cell transistors whose current paths are connected in series between a source region of the fifth select transistor and a drain region of the sixth select transistor;

fourth transistor units formed on the semiconductor substrate, one of the fourth transistor units including a seventh select transistor, a eighth select transistor and fourth cell transistors whose current paths are connected in series between a source region of the seventh select transistor and a drain region of the eighth select transistor;

a fifth section select transistor which is formed on the semiconductor substrate and which has a source region connected to a drain region of the fifth select transistor and has a gate connected to a gate of the first section select transistor;

a sixth section select transistor which is formed on the semiconductor substrate and which has a source region connected to the drain region of the fifth section select transistor, the source region being electrically connected to a drain region of the sixth section select transistor, and has a gate connected to a gate of the second section select transistor;

a seventh section select transistor which is formed on the semiconductor substrate and which has a source region connected to a drain region of the seventh select transistor and has a gate connected to a gate of the third section select transistor;

a eighth section select transistor which is formed on the semiconductor substrate and which has a source region connected to a drain region of the seventh section select transistor, the source region being electrically connected to a drain region of the eighth section select transistor, the drain region shared with the drain region of the sixth section select transistor, and has a gate connected to a gate of the fourth section select transistor;

a second contact plug which is formed on the drain region of the sixth and eighth section select transistor and which is connected to the bit line.

9. The device according to claim 8, further comprising a third contact plug formed on the source region of the sixth section select transistor;

a fourth contact plug formed on the source region of the eighth section select transistor; and a metal wiring layer which connects the first to fourth contact plugs in common.

10. The device according to claim 8, further comprising a diffusion layer which is formed in the semiconductor substrate and which connects the drain region and the source region of the sixth section select transistor, and the drain region and the source region of the eighth section select transistor in common.

* * * * *